United States Patent [19]
Oyamatsu et al.

[11] Patent Number: 6,091,130
[45] Date of Patent: Jul. 18, 2000

[54] SEMICONDUCTOR DEVICE HAVING STRUCTURE SUITABLE FOR CMP PROCESS

[75] Inventors: Hisato Oyamatsu; Masayuki Murota, both of Yokohama, Japan

[73] Assignee: Kabushiki Kaisha Toshiba, Kawasaki, Japan

[21] Appl. No.: 08/996,402

[22] Filed: Dec. 22, 1997

[30] Foreign Application Priority Data

Dec. 26, 1996 [JP] Japan .................................. 8-349037

[51] Int. Cl.[7] .......................... H01L 29/06; H01L 21/302; H01L 21/461

[52] U.S. Cl. .......................... 257/619; 257/618; 257/730; 257/752; 438/689; 438/690; 438/691; 438/692

[58] Field of Search .................................. 257/618, 619, 257/620, 623, 758, 624, 625, 798, 730, 752, 647; 438/689, 690, 691, 692

[56] References Cited

U.S. PATENT DOCUMENTS

| | | | |
|---|---|---|---|
| 4,603,374 | 7/1986 | Wasielewski | 361/389 |
| 4,907,065 | 3/1990 | Sahakian | 257/730 |
| 5,289,019 | 2/1994 | Terashima | 257/618 |
| 5,304,831 | 4/1994 | Yilmaz et al. | 257/620 |
| 5,317,186 | 5/1994 | Wills et al. | 257/620 |
| 5,451,804 | 9/1995 | Lur et al. | 257/330 |
| 5,459,096 | 10/1995 | Venkatesan et al. | 437/67 |
| 5,500,558 | 3/1996 | Hayashide | 257/758 |
| 5,834,845 | 11/1998 | Stolmeijer | 257/752 |
| 5,919,548 | 7/1999 | Barron et al. | 438/691 |

*Primary Examiner*—David Hardy
*Assistant Examiner*—Jesse A. Fenty
*Attorney, Agent, or Firm*—Finnegan, Henderson, Farabow, Garrett & Dunner, L.L.P.

[57] ABSTRACT

A convex portion is formed along the edge of a semiconductor substrate to surround a chip region on the main surface side of the semiconductor substrate. For example, the convex portion is formed part of the semiconductor substrate. The height of the convex portion is set to approximately the same height as the surface of an insulating film attained after the end of the CMP (chemical mechanical polishing) process effected for the insulating film. The width the of the convex portion is set smaller than the width from the edge of the semiconductor substrate to a position in front of the chip region. The semiconductor substrate is attached to a carrier and the CMP process is effected by use of a polishing pad and a slurry. At the time of CMP, since a local heavy load occurring in the edge portion of the semiconductor substrate is applied only to the convex portion, the wafer edge over-polishing will not occur.

24 Claims, 15 Drawing Sheets

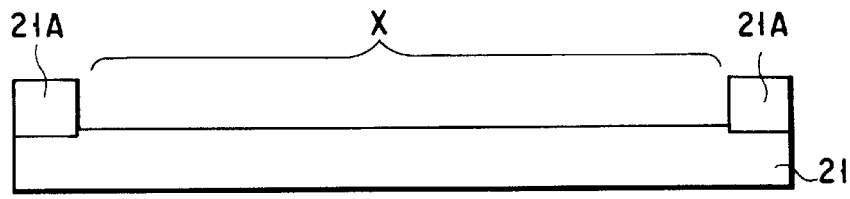
F I G. 27
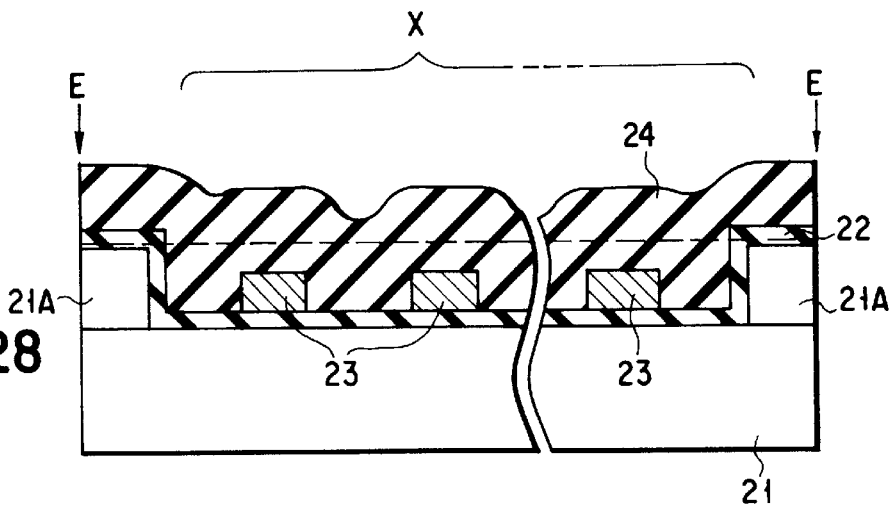
F I G. 28
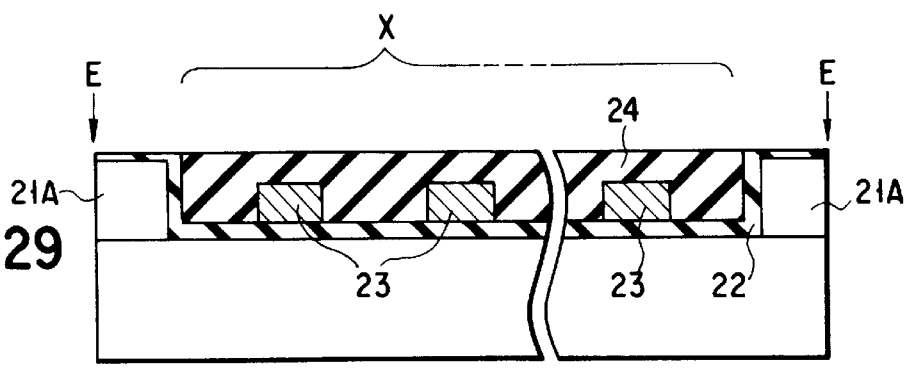
F I G. 29
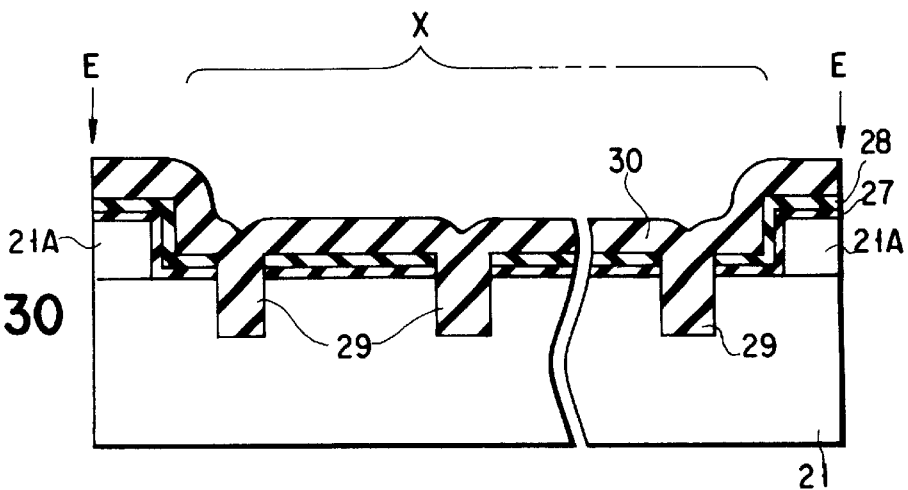
F I G. 30

SEMICONDUCTOR DEVICE HAVING STRUCTURE SUITABLE FOR CMP PROCESS

BACKGROUND OF THE INVENTION

This invention relates to a semiconductor device having a structure suitable for a CMP (chemical mechanical polishing) process.

The CMP process is a technique frequently used for planarizing the surfaces of an insulating film and conductive film on a semiconductor substrate or filling a conductive film only in trenches or grooves.

Particularly, as the technique for planarizing the insulating film on the semiconductor substrate, the CMP process capable of realizing the flat surface with high precision becomes dominant instead of the planarization technique such as the high-temperature reflow technique and resist etchback technique according to the requirement of lowering of the process temperature due to miniaturization of recent semiconductor elements and a reduction in the focusing margin of photolithography.

When the CMP process is used in the semiconductor manufacturing process, a variation in the planarization of the global area occurring in the entire wafer surface after the end of the CMP process and a variation in the planarization of local areas occurring in a plurality of chip regions in the plane of the wafer are important factors.

In the CMP process, the latter variation in the planarization of the local areas is extremely small and the CMP process is excellent for planarization of the local areas.

However, the CMP process is not always excellent for planarization of the global area, and in the prior art, in order to improve the variation in the planarization of the global area, various devices are made on the CMP device side.

FIGS. 1 and 2 show the schematic structure of a conventional CMP device.

A platen (surface plate) 11 takes a disk-like form and has a rotating shaft. A polishing pad 12 is mounted on the platen 11. The polishing pad 12 is formed of soft non-woven fabric or hard resin.

A film of slurry (which is a solvent containing polishing particles) 13 is formed on the surface of the polishing pad 12.

A wafer carrier 14 holds a wafer 15 by use of a vacuum chuck, for example. The wafer carrier 14 presses the wafer 15 against the polishing pad 12 with a preset pressure so as to permit the slurry 13 to be held between the surface of the polishing pad 12 and the wafer 15.

Also, the wafer carrier 14 has a rotating shaft. The rotating direction a of the platen 11 and the rotating direction b of the wafer carrier are generally set in the same direction in order to reduce a variation in the planarization of the global area.

It is also possible to rotate the wafer carrier 14 in the direction b, and at the same time, revolve the wafer carrier 14 around the rotating shaft of the platen 11 in a direction c while the platen 11 is kept fixed.

In the CMP device of the above structure, the material of the polishing pad 12 gives influence on the flatness of the global area. That is, the flatness of the global area is better in the case of the polishing pad of resin than in the case of the polishing pad of non-woven fabric.

However, if the hard polishing pad which is formed of resin, for example, is used, the following problem occurs.

As shown in FIG. 3, an extremely heavy load caused by the elastic stress of the hard polishing pad 12 is applied to an area extending along the edge portion of the wafer 15, that is, an area inwardly extending from the edge of the wafer 15 by approx. 10 mm maximum.

As a result, the polishing rate for the above area becomes excessively high and cannot be controlled, and the polishing amount in the edge portion of the wafer becomes extremely large in comparison with that in the central portion of the wafer so that a so-called "wafer edge over-polishing" phenomenon in which the edge portion of the wafer 15 is excessively polished occurs.

Generally, beveling is made on the edge portion of the wafer 15, the beveling is made on the order of several $\mu$m and is different from the wafer edge over-polishing occurring on the order of several mm. In the following description, the beveling is omitted in order to prevent confusion of the beveling with the wafer edge over-polishing occurring in the CMP process.

The chip region (element region) in the wafer is generally formed in an area which lies on the inner side separated from the edge of the wafer by at least several mm (for example, at least approx. 2 mm).

Therefore, the wafer edge over-polishing occurring in the CMP process gives various influences on the semiconductor manufacturing process.

FIGS. 4 to 7 show one example of the influences given by the wafer edge over-polishing.

First, as shown in FIG. 4, an insulating film (silicon oxide film) 22 is formed on a wafer (silicon substrate) 21 and a plurality of wirings 23 are formed on the insulating film 22. The plurality of wirings 23 are covered with an insulating film (BPSG film, TEOS film or the like) 24. The surface of the insulating film 24 is made irregular depending on the convex and concave portions of the underlying wirings.

After this, when the insulating film 24 is polished to a portion indicated by broken lines by the CMP process, the surface of the insulating film 24 in the central portion of the wafer 21 is made flat as shown in FIG. 5, but a portion of the insulating film 24 in the edge portion of the wafer 21 is excessively polished and thus the wafer edge over-polishing occurs.

As described before, the wafer edge over-polishing occurs in an area which lies at a maximum distance of approx. 10 mm from the edge E of the wafer 21 and reaches the chip region (element region) X.

Further, as shown in FIG. 6, an insulating film 25 is formed on the insulating film 24 and a conductive film 26' is formed on the insulating film 25. After this, a resist pattern 27' is formed on the conductive film 26' by the photolithography process.

In recent years, the size of the wiring pattern is reduced according to miniaturization of elements and the focusing margin of the photolithography is reduced. Therefore, if the wafer edge over-polishing occurs, the precision of processing of the resist pattern 27' near the wafer edge is lowered.

After this, the conductive film 26' is etched with the resist pattern 27' used as a mask by anisotropic etching.

As a result, as shown in FIG. 7, a plurality of wirings 26 are formed on the insulating film 25. However, the thickness of the insulating film 24 near the wafer edge is smaller than the thickness of the insulating film 24 in the central portion of the wafer 21. A difference in the film thickness of the insulating film 24 changes the capacitive coupling between the upper and lower wirings and may cause noises and cause timing delay in signal transmission.

In addition to the above-described problem, it is known that the wafer edge over-polishing causes dusts in the semiconductor manufacturing process, and in the worst case, the pattern of the wafer edge portion is damaged.

Further, the wafer edge over-polishing also occurs when a film is filled only in trenches or grooves by use of the CMP process, for example, when the element isolation method by STI (Shallow Trench Isolation) is applied or when the wiring pattern is formed by the damascene method.

FIGS. 8 and 9 illustrate the wafer edge over-polishing occurring when the element isolation method by STI is applied.

First, as shown in FIG. 8, an oxide film 27 and polysilicon film 28 are formed on a wafer (silicon substrate) 21. A plurality of trenches 29 are formed in the wafer 21, oxide film 27 and polysilicon film 28. An insulating film 30 for completely filling all of the trenches 29 is formed on the polysilicon film 28.

After this, as shown in FIG. 9, the insulating film 30 is polished by the CMP process and the insulating film 30 is left behind only in the trenches 29. At this time, the polishing rate of the edge portion of the wafer 21 becomes extremely higher than the polishing rate of the central portion of the wafer 21 and the wafer edge over-polishing occurs.

The polysilicon film 28 is used as an etching stopper in the CMP process, but since it is not preferable that the position of the surface of the wafer 21 will be greatly deviated from the highest position of the trench 29, the polysilicon film 28 cannot be made excessively thick. Therefore, the wafer edge over-polishing occurs and the edge portion of the wafer 21 is cut out.

FIG. 10 shows an example of a conventional method for improving the CMP device to prevent occurrence of the wafer edge over-polishing phenomenon in the wafer edge.

The feature of the CMP device is that a guide ring 16 is mounted on a wafer carrier 14. The guide ring 16 is disposed to surround a wafer 15, and since it has elastic members 17 such as springs, the load applied to the edge portion of the wafer 15 can be alleviated.

That is, since the CMP device having the guide ring 16 can set the polishing rate of the central portion of the wafer 15 substantially equal to the polishing rate of the edge portion of the wafer 15 in comparison with a CMP device having no guide ring, occurrence of the wafer edge over-polishing can be suppressed.

However, in the above CMP device, it is difficult to control the load applied to the wafer 15 in order to effectively prevent occurrence of the wafer edge over-polishing, and since the guide ring 16 is a consumable part which tends to be polished, it takes a lot of labor for the replacement thereof and the cost is increased.

Thus, conventionally, when the CMP process is effected, the wafer edge over-polishing phenomenon that the wafer edge portion is excessively polished in comparison with the central portion of the wafer occurs, various problems are caused by the phenomenon and the manufacturing yield will be lowered.

Further, means for preventing occurrence of the phenomenon on the CMP device side is studied, but the means cannot attain a preferable effect since it is difficult to control the load applied to the wafer and it raises the cost.

BRIEF SUMMARY OF THE INVENTION

This invention has been made to solve the above problems, and an object of this invention is to prevent occurrence of the wafer edge over-polishing in the CMP process for planarizing the insulating film, filling an insulating film into the trenches, and filling a conductive film into wiring grooves by improving a semiconductor device polished by use of a CMP device without attaching a new mechanism for preventing occurrence of the wafer edge over-polishing to the CMP device and enhance the manufacturing yield.

In order to attain the above object, a semiconductor wafer of this invention has a ring-form convex portion formed along the edge of the surface on which semiconductor elements are formed. The convex portion is part of the semiconductor wafer or an epitaxial layer of the semiconductor wafer.

The width of the convex portion is smaller than the width from the edge of the semiconductor wafer to a position in front of the chip region, and more specifically, it is set to a preset value within a range of 0.5 to 1.5 mm.

A semiconductor wafer manufacturing method of this invention comprises the steps of uniformly polishing the (central portion of the surface of a semiconductor wafer on which semiconductor elements are formed; and forming a ring-form convex portion along the edge of the semiconductor wafer.

The polishing step is effected by fixing the semiconductor wafer and rotating a polishing ring having a rotating shaft which coincides with the center of the semiconductor wafer while the polishing ring is kept in contact with the semiconductor wafer.

A semiconductor wafer manufacturing method of this invention comprises the steps of forming an insulating film on the entire surface of a semiconductor wafer; removing part of the insulating film which lies on an area extending along the edge of the surface of the semiconductor wafer on which semiconductor elements are formed so as to form an exposed portion of the semiconductor wafer; and forming a ring-form convex portion extending along the edge of the semiconductor wafer by forming an epitaxial layer only on the exposed portion of the semiconductor wafer by epitaxial growth.

A semiconductor device of this invention comprises a semiconductor wafer having a ring-form convex portion formed to extend along the edge of the surface on which semiconductor elements are formed; a plurality of wirings formed on a chip region of the semiconductor wafer; and an insulating film formed to cover the plurality of wirings; wherein the surface of the insulating film is made flat.

The surface of the insulating film lies near the upper surface of the convex portion and the insulating film is formed of one of a BPSG film, TEOS film and LPD-SiO$_2$ film.

A semiconductor device manufacturing method of this invention comprises the steps of forming a semiconductor wafer having a ring-form convex portion formed to extend along the edge of the surface on which semiconductor elements are formed; forming a plurality of wirings formed on a chip region in the central portion of the semiconductor wafer; forming an insulating film to cover the plurality of wirings; polishing the insulating film by CMP; and making the surface of the insulating film flat.

The step of polishing the insulating film is effected until the surface of the insulating film comes near the upper surface of the convex portion.

A semiconductor device of this invention comprises a semiconductor wafer having a ring-form convex portion formed to extend along the edge of the surface on which semiconductor elements are formed; a plurality of trenches formed in a chip region of the semiconductor wafer; and an insulating film filled in the plurality of trenches.

A semiconductor device manufacturing method of this invention comprises the steps of forming a semiconductor wafer having a ring-form convex portion formed to extend along the edge of the surface on which semiconductor elements are formed; forming a plurality of trenches formed in a chip region in the central portion of the semiconductor wafer; forming an insulating film for completely filling the plurality of trenches on the chip region; polishing the insulating film by CMP to leave the insulating film in the plurality of trenches.

A semiconductor device of this invention comprises a semiconductor wafer; a first insulating film formed on the semiconductor wafer; and a ring-form convex portion formed on the first insulating film to extend along the edge of the semiconductor wafer.

The convex portion is formed of one of polysilicon, silicon nitride, carbon, tungsten, tungsten silicide, titanium, and titanium silicide.

The width of the convex portion is smaller than the width from the edge of the semiconductor wafer to a position in front of the chip region, and more specifically, it is set to a preset value within a range of 0.5 to 1.5 mm.

The semiconductor device of this invention further comprises a plurality of wirings covered with the first insulating film; and a second insulating film formed on the first insulating film; wherein the surface of the second insulating film is made flat.

The surface of the second insulating film lies near the upper surface of the convex portion and the insulating film is formed of one of a BPSG film, TEOS film and LPD-SiO$_2$ film.

The plurality of wirings include at least gate electrodes of MOS transistors.

The semiconductor device of this invention further comprises a plurality of trenches formed in the first insulating film and the semiconductor wafer; and a second insulating film filled in the plurality of trenches.

A material forming the convex portion has a selective ratio of the polishing rate of CMP with respect to a material forming the second insulating film.

A semiconductor device manufacturing method of this invention comprises the steps of forming a plurality of wirings on a chip region in the central portion of a semiconductor wafer; forming a first insulating film which covers the plurality of wirings; forming a ring-form convex portion along the edge of the semiconductor wafer on the first insulating film; forming a second insulating film on the first insulating film and the convex portion; and polishing the second insulating film by CMP to make the second insulating film flat.

The step of polishing the second insulating film is effected until the surface of the second insulating film comes near the upper surface of the convex portion.

A semiconductor device manufacturing method of this invention comprises the steps of forming a first insulating film on a semiconductor wafer; forming a ring-form convex portion along the edge of the semiconductor wafer on the first insulating film and forming a plurality of trenches in a chip region in the central portion of the semiconductor wafer; forming a second insulating film for completely filling the plurality of trenches on the chip region; and polishing the second insulating film by CMP to leave the insulating film in the plurality of trenches.

A semiconductor device of this invention comprises a semiconductor wafer; a plurality of first wirings formed on a chip region of the semiconductor wafer; a first insulating film formed to cover the plurality of first wirings; a first ring-form convex portion formed on the first insulating film along the edge of the semiconductor wafer; a second insulating film having a flat surface and formed on the first insulating film with the surface thereof set near the upper surface of the first convex portion; a plurality of second wirings formed on the second insulating film in the chip region of the semiconductor wafer; a second ring-form convex portion formed on the second insulating film along the edge of the semiconductor wafer; and a third insulating film having a flat surface and formed on the second insulating film with the surface thereof set near the upper surface of the second convex portion.

Each of the first and second convex portions is formed of one of polysilicon, silicon nitride, carbon, tungsten, tungsten silicide, titanium, and titanium silicide.

The width of each of the first and second convex portions is smaller than the width from the edge of the semiconductor wafer to a position in front of the chip region, and more specifically, it is set to a preset value within a range of 0.5 to 1.5 mm.

Each of the second and third insulating films is formed of one of a BPSG film, TEOS film and LPD-SiO$_2$ film.

A material forming the first convex portion has a selective ratio of the polishing rate of CMP with respect to a material forming the second insulating film, and a material forming the second convex portion has a selective ratio of the polishing rate of CMP with respect to a material forming the third insulating film.

A semiconductor device of this invention comprises a semiconductor wafer; a plurality of first wirings formed on a chip region of the semiconductor wafer; a first insulating film formed to cover the plurality of first wirings; a ring-form convex portion formed on the first insulating film along the edge of the semiconductor wafer; a second insulating film having a flat surface and formed on the first insulating film with the surface thereof set lower than the upper surface of the convex portion; a plurality of second wirings formed on the second insulating film in the chip region of the semiconductor wafer; and a third insulating film having a flat surface and formed on the second insulating film to cover the plurality of second wirings with the surface thereof set near the upper surface of the convex portion.

A semiconductor device of this invention comprises a semiconductor wafer; a ring-form convex portion formed along the edge of the surface of the semiconductor wafer on which semiconductor elements are formed; an insulating film having a flat surface and formed on the chip region of the semiconductor wafer with the surface thereof set near the upper surface of the convex portion; a plurality of wiring grooves formed in the insulating film; and a conductive film filled in the plurality of wiring grooves.

The convex portion is formed of one of polysilicon, silicon nitride, carbon, tungsten, tungsten silicide, titanium, and titanium silicide.

The width of the convex portion is smaller than the width from the edge of the semiconductor wafer to a position in front of the chip region, and more specifically, it is set to a preset value within a range of 0.5 to 1.5 mm.

Each of the second and third insulating films is formed of one of a BPSG film, TEOS film and LPD-SiO$_2$ film. The insulating film is also formed of one of a BPSG film, TEOS film and LPD-SiO$_2$ film.

A material forming the convex portion has a selective ratio of the polishing rate of CMP with respect to a material forming the second insulating film or the insulating film.

A semiconductor device manufacturing method of this invention comprises the steps of forming a ring-form convex portion along the edge of the surface of a semiconductor wafer on which semiconductor elements are formed; forming an insulating film on a chip region of the semiconductor wafer; polishing the insulating film by CMP until the surface of the insulating film comes near the upper surface of the convex portion; forming wiring grooves in the insulating film; forming a conductive film on the insulating film to completely fill the wiring grooves; and polishing the conductive film by CMP to leave the conductive film only in the wiring grooves.

A CMP device of this invention is formed to treat a semiconductor device having a ring-form convex portion formed of a conductive film and extending along the edge of the surface of the semiconductor wafer on which semiconductor elements are formed and comprises a platen; a polishing pad disposed on the platen; a wafer carrier for holding the semiconductor device and pressing the polishing surface of the semiconductor device against the polishing pad with a preset pressure; and a measuring unit connected between a slurry on the polishing pad and the convex portion of the semiconductor device, for monitoring a polishing amount of the polishing surface of the semiconductor device.

The measuring unit is an ammeter and the polishing amount of the polishing surface of the semiconductor device is detected by monitoring the current of the ammeter.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 27 is a cross sectional view showing one step in the semiconductor wafer manufacturing method of FIG. 22;

FIG. 28 is a cross sectional view showing one example of a semiconductor device using the semiconductor wafer of FIG. 22;

FIG. 29 is a cross sectional view showing the structure of the semiconductor device of FIG. 28 after CMP;

FIG. 30 is a cross sectional view showing a second example of a semiconductor device using the semiconductor wafer of FIG. 22;

DETAILED DESCRIPTION OF THE INVENTION

There will now be described a semiconductor device and a manufacturing method of this invention in detail with reference to the accompanying drawings.

Figure 1:
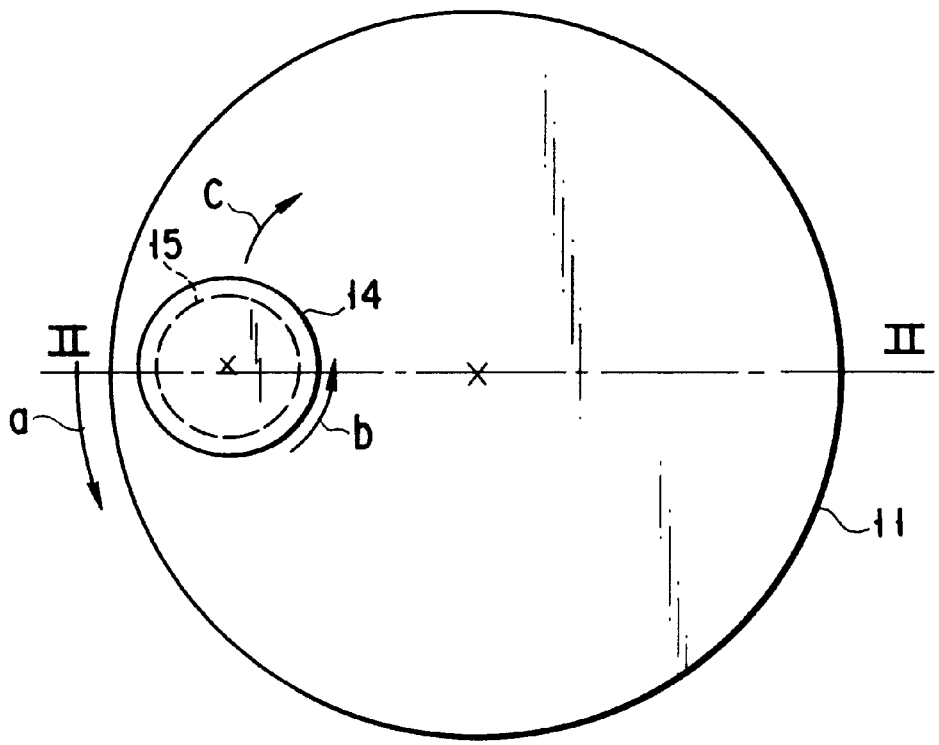
FIG. 1 is a plan view schematically showing a conventional CMP device.
Figure 2:
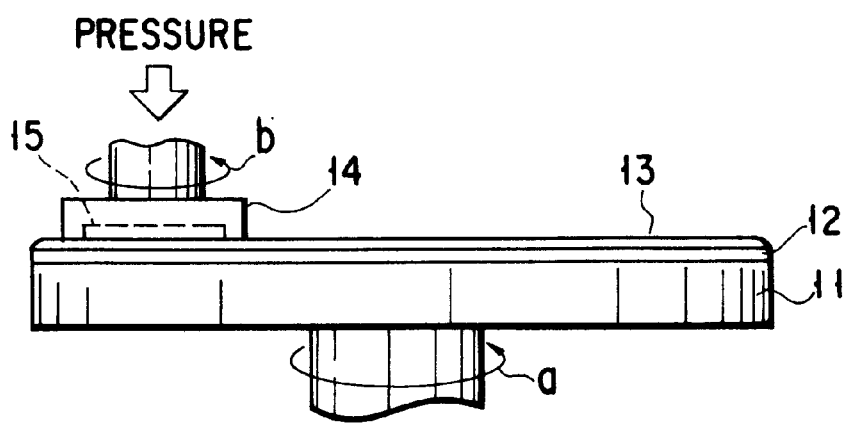
FIG. 2 is a cross sectional view taken along the line II—II of FIG. 1.
Figure 3:
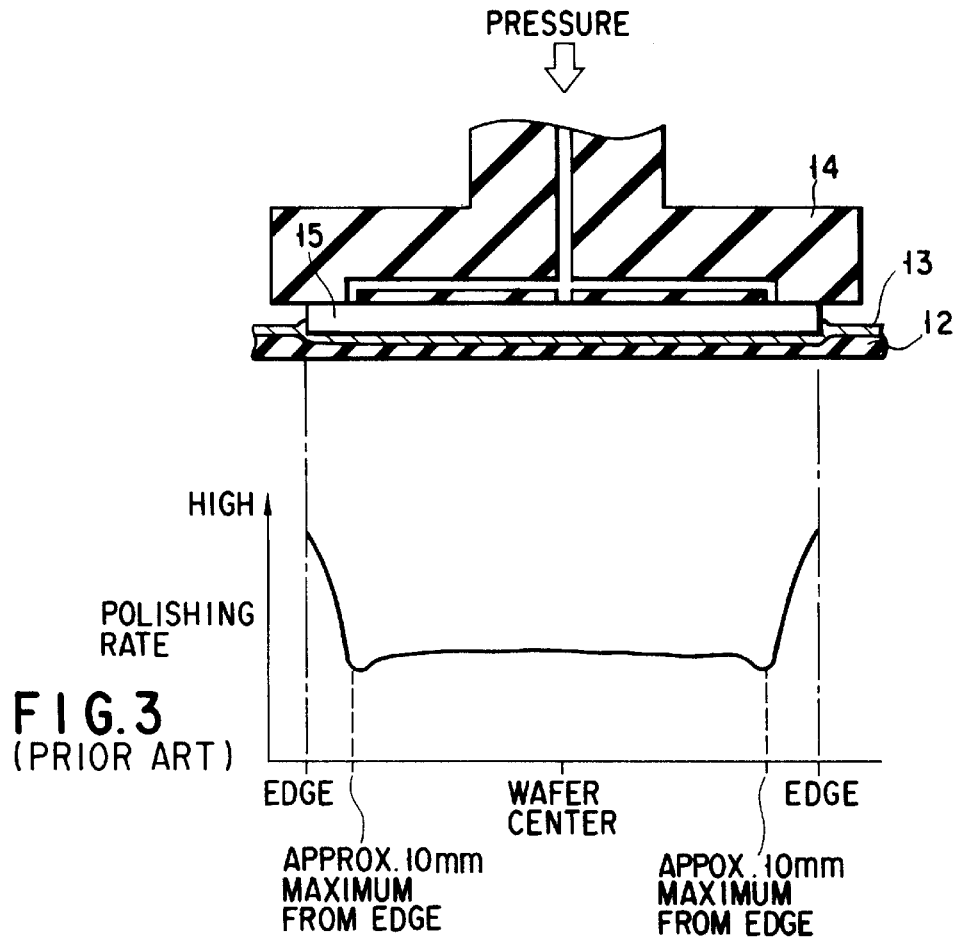
FIG. 3 shows the polishing rate in the surface of a wafer and a wafer holder.
Figure 4:
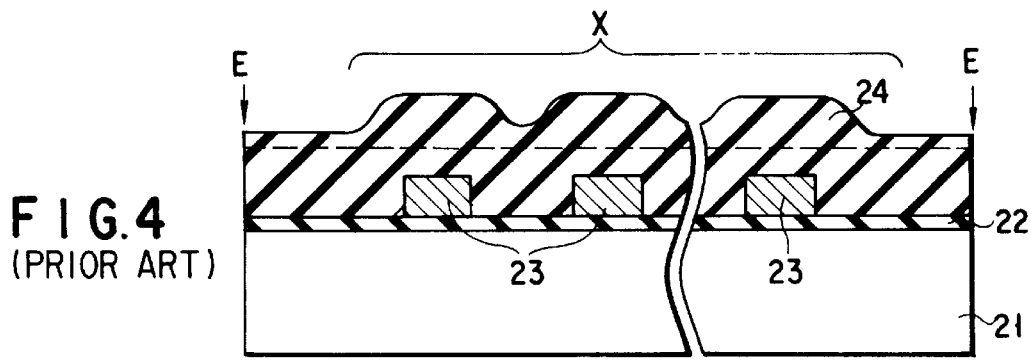
FIG. 4 is a cross sectional view showing one step in the conventional CMP process.
Figure 5:
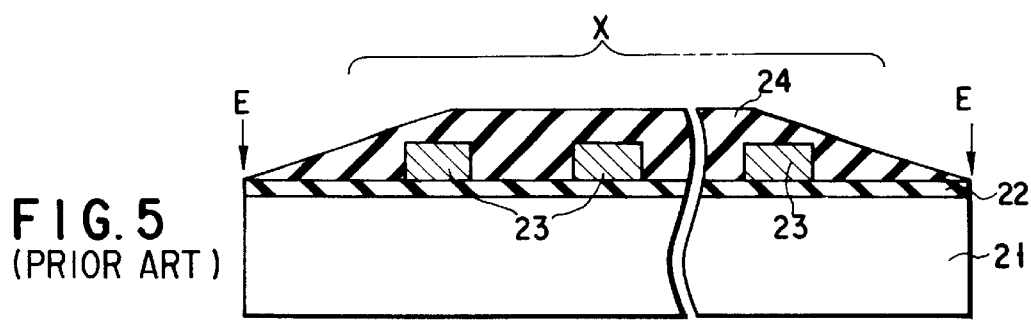
FIG. 5 is a cross sectional view showing one step in the conventional CMP process.
Figure 6:
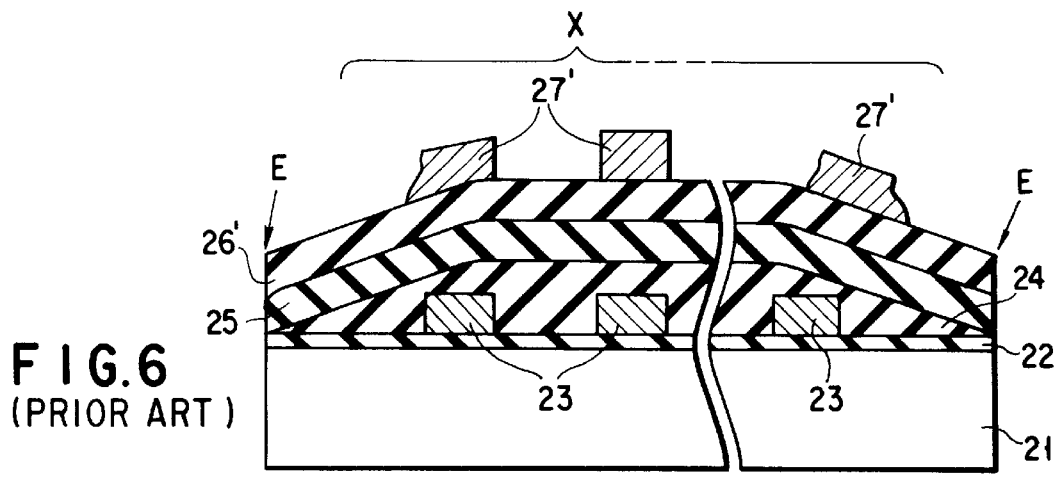
FIG. 6 is a view for illustrating a defect occurring when the conventional CMP process is applied.
Figure 7:
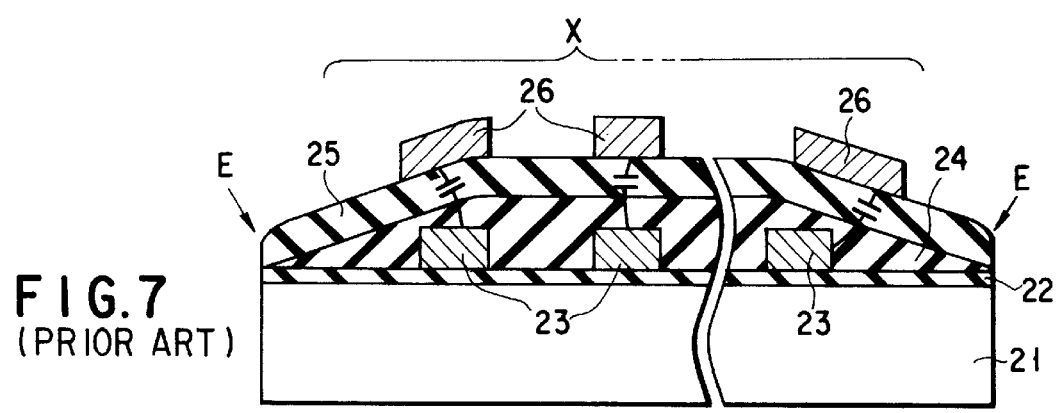
FIG. 7 is a view for illustrating a defect occurring when the conventional CMP process is applied.
Figure 8:
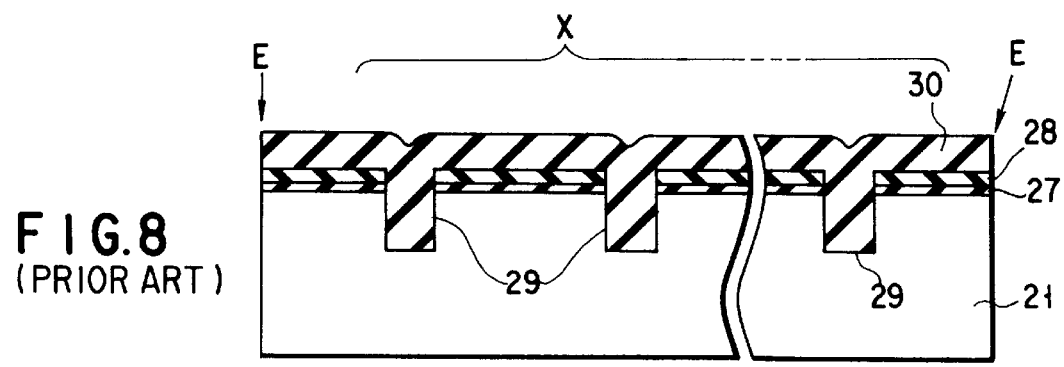
FIG. 8 is a cross sectional view showing one step in the conventional CMP process.
Figure 9:
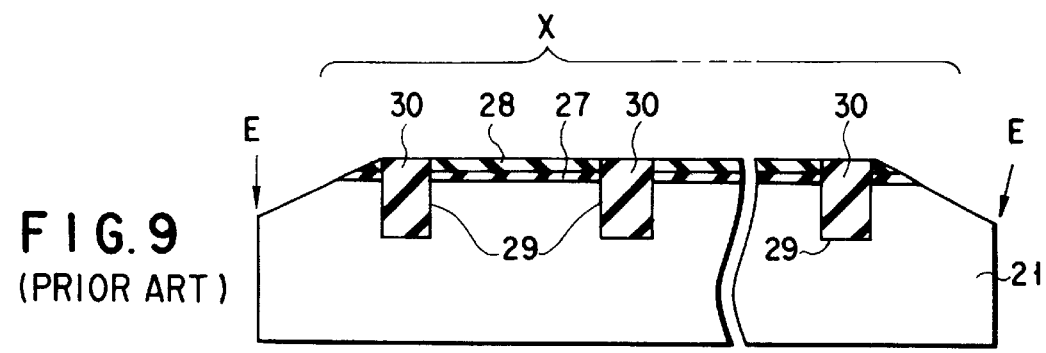
FIG. 9 is a cross sectional view showing one step in the conventional CMP process.
Figure 10:
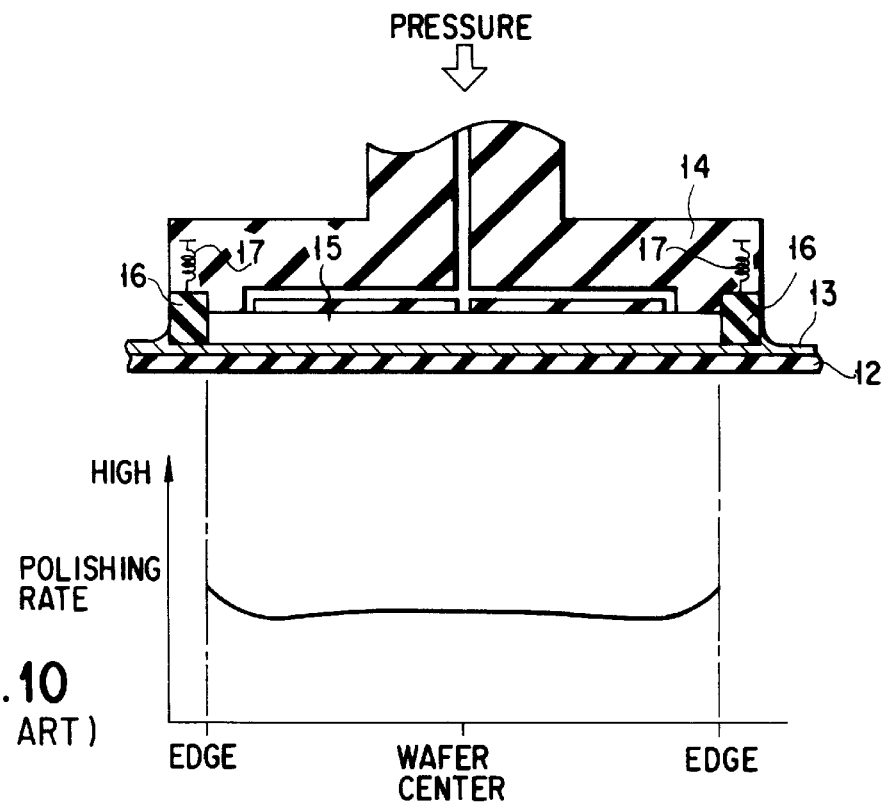
FIG. 10 shows the polishing rate in the surface of a wafer and a wafer holder.
Figure 11:
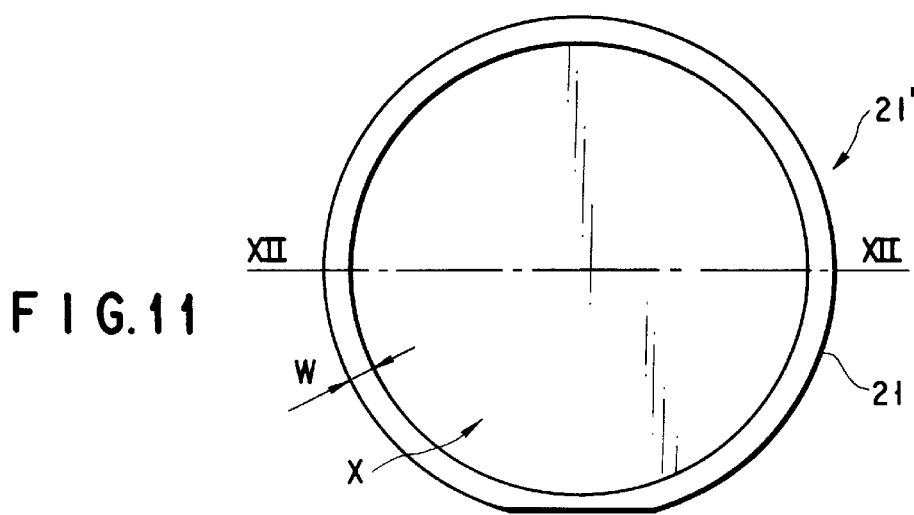
FIG. 11 is a plan view showing one example of a semiconductor wafer of this invention.
Figure 12:
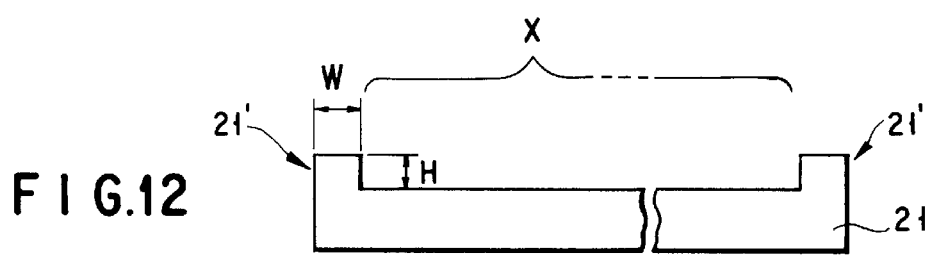
FIG. 12 is a cross sectional view taken along the line XII—XII of FIG. 11.

[A] FIGS. 11 and 12 show a first example of the semiconductor wafer of this invention.

A convex portion 21' is formed in an area extending along the edge of a wafer 21 on the main surface (the surface on which elements are formed) side of the wafer 21, that is, in an area inwardly extending from the edge of the wafer 21 to a position in front of a chip region (element region) X by a preset distance (several mm).

The convex portion 21' is formed of part of the wafer 21 and is formed by polishing the central portion (chip region) of the main surface of a normal wafer by a preset amount.

The height H and the width W of the convex portion 21' are set to preset values according to various parameters such as the elastic stress of the polishing pad, the semiconductor manufacturing process, and the type, structure and size of elements formed on the wafer, and the height H is roughly set in a range of $0.1 \leq H \leq 100$ $\mu$m and the width W is set in a range of $0 \leq W \leq 2$ to 5 mm (the width from the edge to the chip region).

The specific dimensions of the convex portion 21' are explained in an embodiment described later. The wafer 21 may be a wafer formed of semiconductor such as silicon or GaAs (gallium arsenide) or a wafer having an SOI (Silicon On Insulator) structure such as SIMOX (Separation By Implanted Oxygen).

Further, the edge portion of the wafer 21 is generally subjected to the beveling process by an amount on the order of approx. several $\mu$m. However, since the beveling process is not particularly related to this invention, the beveled portion is omitted in the drawing for clarifying the explanation.

Since the heavy load in the wafer edge portion caused by the elastic stress of the polishing pad is applied to the convex portion 21' formed on the edge portion of the wafer 21 when the semiconductor wafer with the above structure is used, the wafer edge over-polishing will not occur even if the CMP process is used in the semiconductor manufacturing process.

That is, since the heavy load in the wafer edge portion is applied only to the convex portion 21', no influence is given to the chip region (element region) X lying on the inner side from the convex portion, and therefore, a high yield can be attained in the semiconductor manufacturing process.

Figure 13:
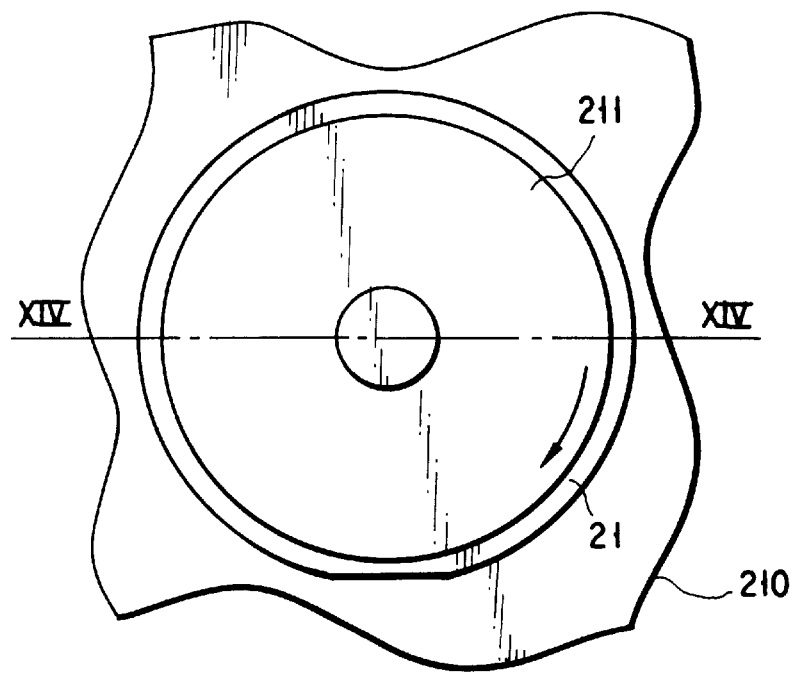
FIG. 13 is a plan view showing a polishing device used for manufacturing a semiconductor wafer of FIG. 11.
Figure 14:
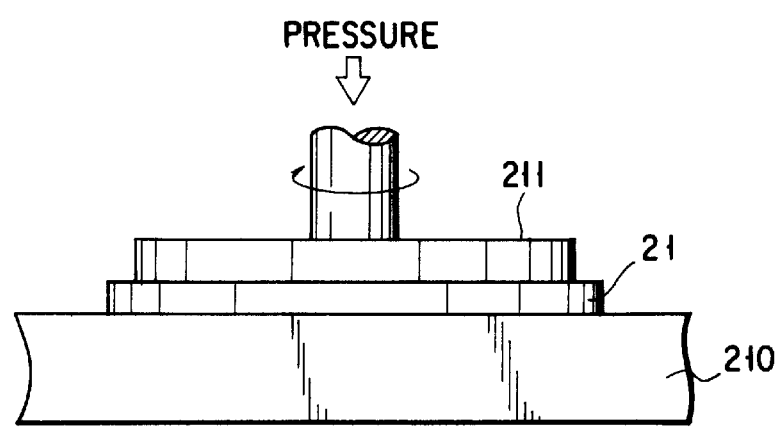
FIG. 14 is a cross sectional view taken along the line XIV—XIV of FIG. 13.
Figure 15:
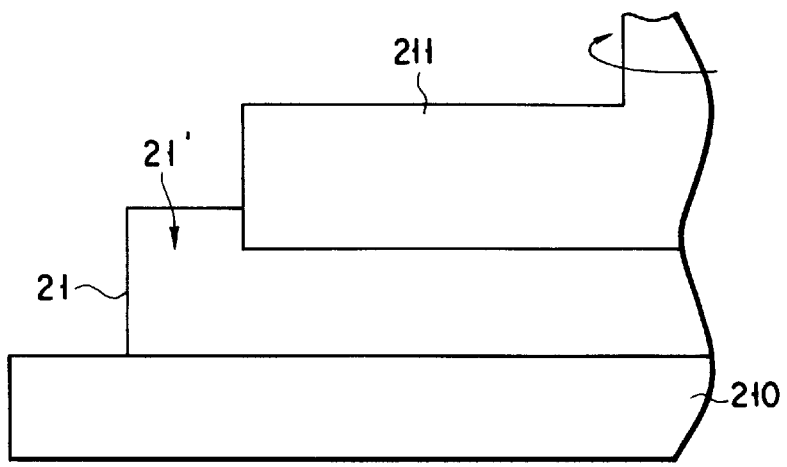
FIG. 15 is an enlarged view showing an enlarged portion in FIG. 14.

Next, a method for manufacturing the semiconductor wafer shown in FIGS. 11 and 12 is explained with reference to FIGS. 13 to 15.

First, a normal wafer 21 with a thickness of 600 to 700 $\mu$m is placed and fixed on a wafer table 210. Further, a polishing ring 211 is moved onto the wafer 21. The size (diameter) of the polishing ring 211 is set to be smaller than that of the wafer 21 by approx. several mm (corresponding to the width of the convex portion 21').

After this, the polishing ring 211 is rotated in a preset direction while a preset pressure is being applied to the wafer 21 via the polishing ring 211 so as to mirror-polish the wafer 21 by a preset amount (corresponding to the height of the convex portion 21'). At this time, it is required that the rotating shaft of the polishing ring 211 almost coincide with the center of the wafer 21.

Thus, the convex portion 21' can be easily formed on the edge portion of the wafer 21 on the main surface side of the wafer 21.

Next, a case wherein the CMP process is effected for a semiconductor device using the above semiconductor wafer is explained.

(a) First Example

This embodiment relates to the CMP process effected when the irregular surface portion of the insulating film on the wiring is made flat.

Figure 16:
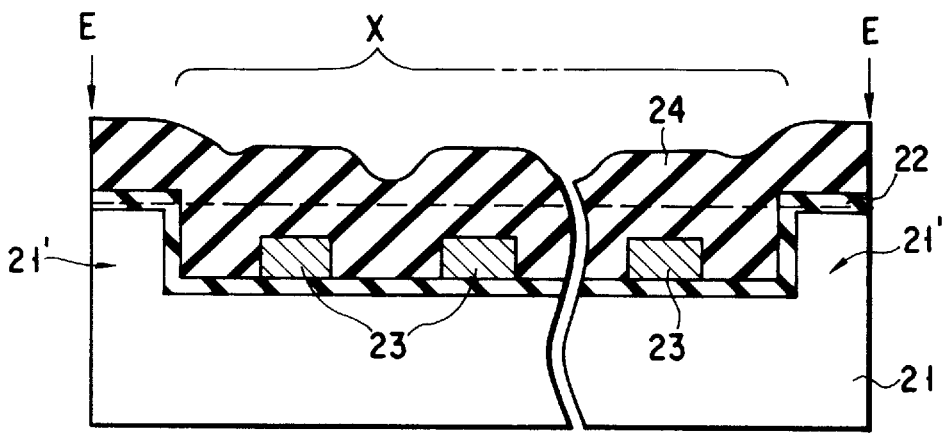
FIG. 16 is a cross sectional view showing one example of a semiconductor device using a semiconductor wafer of FIG. 11.

First, as shown in FIG. 16, a wafer (silicon wafer) 21 with a thickness of 600 to 700 $\mu$m having a convex portion 21' formed along the edge thereof is prepared. The height H of the convex portion 21' is set to such a value that the upper surface of the convex portion 21' is set at substantially the same level (for example, approx. 0.04 $\mu$m) as the surface of the insulating film obtained after CMP. The width W of the convex portion 21' is set to a value (for example, which is equal to or smaller than 2 mm, and preferably, 0.5 to 1.5 mm) smaller than the width from the wafer edge to the chip region.

Next, an insulating film (silicon oxide film) 22 is formed on the main surface of the wafer 21 by the thermal oxidation method, for example. Further, a plurality of wirings 23 formed of a conductive material such as polysilicon containing impurity, aluminum or copper are formed on the insulating film 22 by a known method.

After this, an insulating film (BPSG film, TEOS film or the like) 24 for completely covering the plurality of wirings 23 is formed with a film thickness of approx. 1 $\mu$m on the insulating film 22 by the LPCVD method, for example. The insulating film 24 may be an LPD (liquid phase deposition)-$SiO_2$ film containing fluorine and formed by the liquid phase growth method. In this case, the surface of the insulating film 24 is made irregular because of the presence of the underlying wirings 23.

Figure 17:
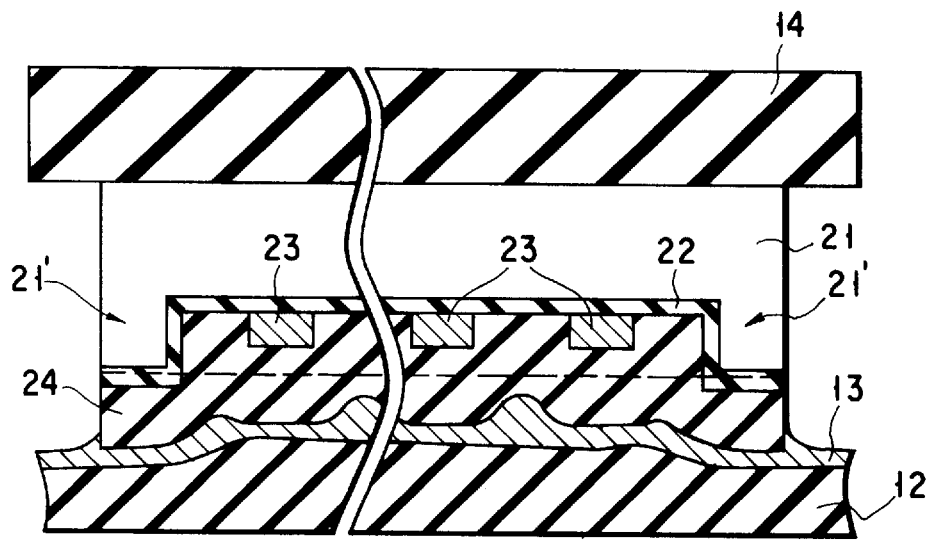
FIG. 17 is a cross sectional view showing the structure of the semiconductor device of FIG. 16 at the time of CMP.

Therefore, as shown in FIG. 17, the wafer 21 is fixed on the wafer carrier 14 and the insulating film 24 is polished to a portion indicated by broken lines by CMP. When the CMP process is effected, a hard polishing pad 12 of resin or the like and a slurry (polishing solvent) 13 containing polishing particles such as cerium oxide (CeO) or ceria are used.

Figure 18:
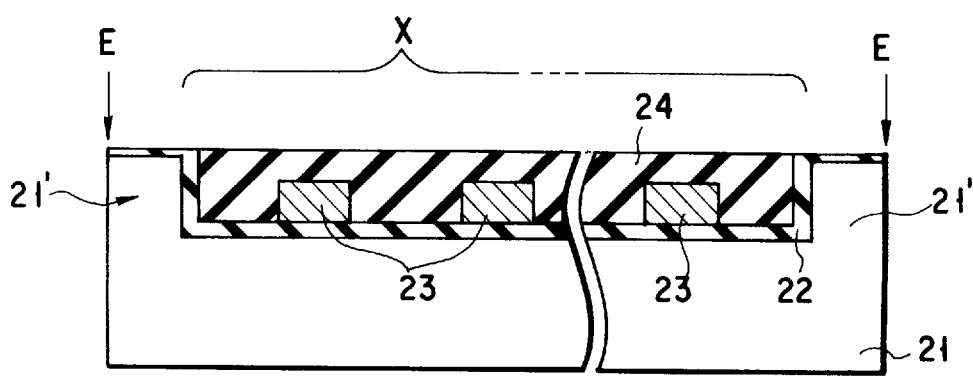
FIG. 18 is a cross sectional view showing the structure of the semiconductor device of FIG. 16 after CMP.

FIG. 18 shows the state obtained after the end of the CMP process. As is clearly seen from FIG. 18, the over-polishing does not occur in the edge of the wafer 21 and the flatness of the insulating film 24 after the end of the CMP process is improved.

Figure 19:
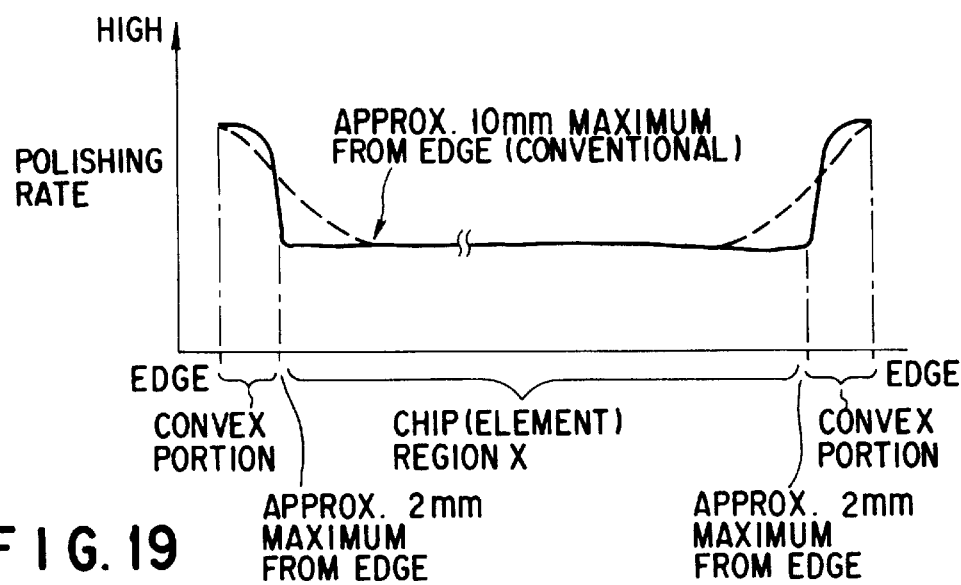
FIG. 19 is a diagram showing the distribution of the polishing rate in the surface of the wafer of the semiconductor device of FIG. 16.

That is, as shown in FIG. 19, this embodiment is the same as the conventional case in that a local heavy load is applied to the edge portion of the wafer 21 and the polishing rate of the edge portion of the wafer 21 is higher than the polishing rate of the central portion of the wafer 21.

However, in this invention, since the convex portion 21' is formed to previously set the height of part of the insulating film 24 which lies on the edge portion of the wafer 21 larger than that of part of the insulating film 24 which lies on the central portion of the wafer 21, the surface of part of the insulating film 24 which lies on the edge portion of the wafer 21 is set to the same height as the surface of part of the insulating film 24 which lies on the central portion of the wafer 21 after the end of the CMP process.

For example, since the drooping amount of the edge portion of the wafer 21 is 0.4 to 0.5 $\mu$m, the height of the convex portion 21' is set to approx. 0.4 $\mu$m, the thickness of the insulating film 24 is set to 1 $\mu$m, and the insulating film 24 is polished by approx. 0.6 $\mu$m by the CMP process.

Then, the height of part of the insulating film 24 which remains on the central portion of the wafer 21 becomes 0.4 $\mu$m, substantially the entire portion of the insulating film 24 which lies on the edge portion of the wafer 21 is polished and the convex portion 21' of the height of 0.4 $\mu$m appears, and as a result, the flatness of the insulating film 24 after the end of the CMP process can be improved.

If the materials of the wafer 21 and the insulating film 24 have a high selective ratio with respect to the polishing rate of CMP, the high-degree flatness of the insulating film 24 can always be attained in the chip region (element region) X by setting the height H of the convex portion 21' such that the upper surface of the convex portion 21' will become equal to or higher than the surface of the insulating film after the end of CMP.

(b) Second Example

This embodiment relates to the CMP process effected when an insulating film is filled only in trenches formed in the wafer (STI).

Figure 20:
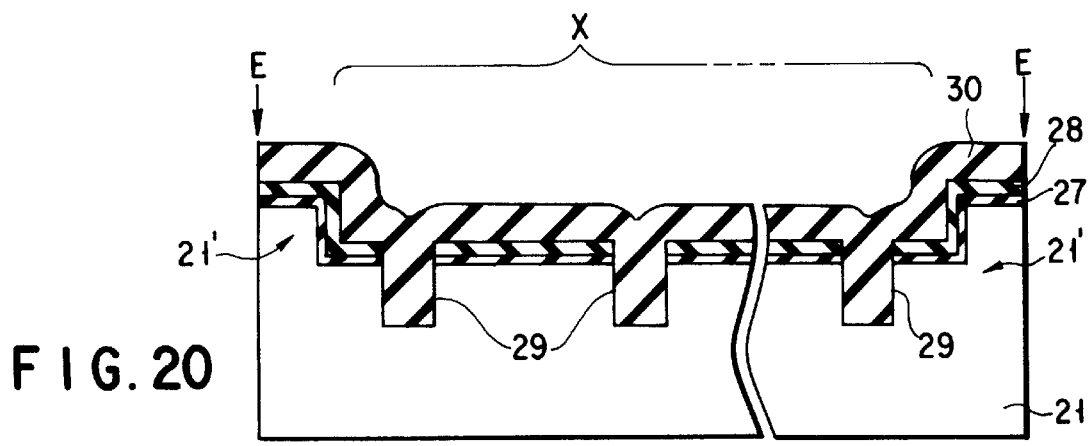
FIG. 20 is a cross sectional view showing a second example of a semiconductor device using a semiconductor wafer of FIG. 11.

First, as shown in FIG. 20, a wafer (silicon wafer) 21 with a thickness of 600 to 700 $\mu$m having a convex portion 21' formed along the edge thereof is prepared. The height H of the convex portion 21' is set to a preset value (for example, approx. 0.4 $\mu$m) and the width W of the convex portion 21' is set to a value (for example, which is equal to or smaller than 2 mm, and preferably, 0.5 to 1.5 mm) smaller than the width from the wafer edge to the chip region.

Next, an oxide film (silicon oxide film) 27 with a thickness of approx. 0.01 $\mu$m is formed on the main surface of the wafer 21 by the thermal oxidation method, for example. Further, a polysilicon film 28 with a thickness of approx. 0.1 $\mu$m is formed on the oxide film 27 by use of the LPCVD method, for example.

Further, a resist pattern is formed on the polysilicon film 28 by the photolithography process. The wafer 21, oxide film 27 and polysilicon film 28 are selectively etched by anisotropic etching (such as RIE) with the resist pattern used as a mask so as to form a plurality of trenches 29. After this, the resist pattern is removed.

Further, an insulating film (such as a TEOS film) 30 used for completely filling the plurality of trenches 29 is formed to a thickness of approx. 1 $\mu$m on the polysilicon film 28.

Next, the insulating film 30 is polished by CMP so that the insulating film will be left behind only in the trenches 29.

When the CMP process is effected, a hard polishing pad of resin or the like and a slurry (polishing solvent) containing polishing particles such as cerium oxide (CeO) or ceria are used.

Figure 21:
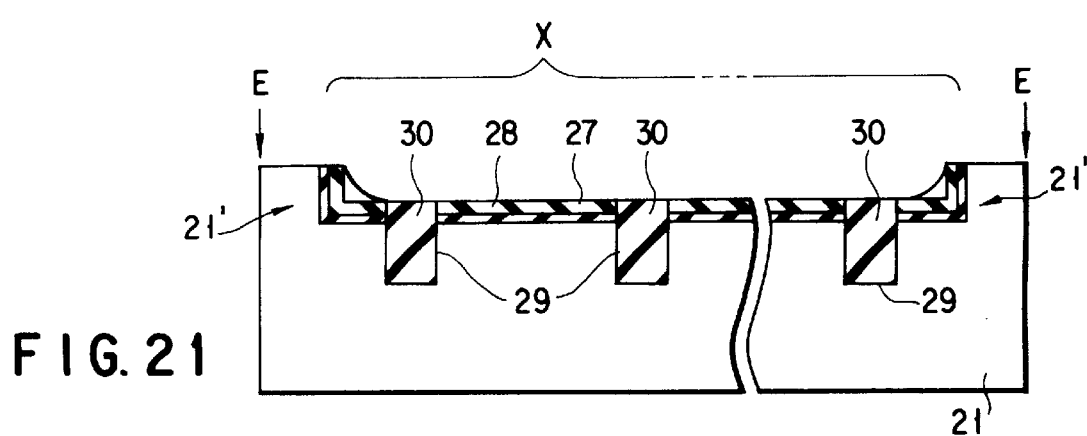
FIG. 21 is a cross sectional view showing the structure of the semiconductor device of FIG. 20 after CMP.

FIG. 21 shows the state obtained after the end of the CMP process. As shown in FIG. 21, the over-polishing does not occur in the edge of the wafer 21 and the convex portion 21' of the wafer 21 is left behind substantially as it is. That is, the insulating film 30 can be filled only in the trenches 29 to complete the STI structure while preventing occurrence of the wafer edge over-polishing.

In this embodiment, the height of the convex portion 21' is set to such a value that the convex portion 21' will be left behind after the end of the CMP process. That is, occurrence of the over-polishing which may occur in a range of 10 mm maximum from the edge of the wafer 21 can be effectively prevented because of the presence of the convex portion 21' even if a local heavy load is applied to the edge portion of the wafer 21 at the time of CMP.

If the materials of the wafer 21 and the insulating film 24 have a high selective ratio with respect to the polishing rate of CMP, the height of the convex portion 21' can be set to a relatively small value.

Figure 22:
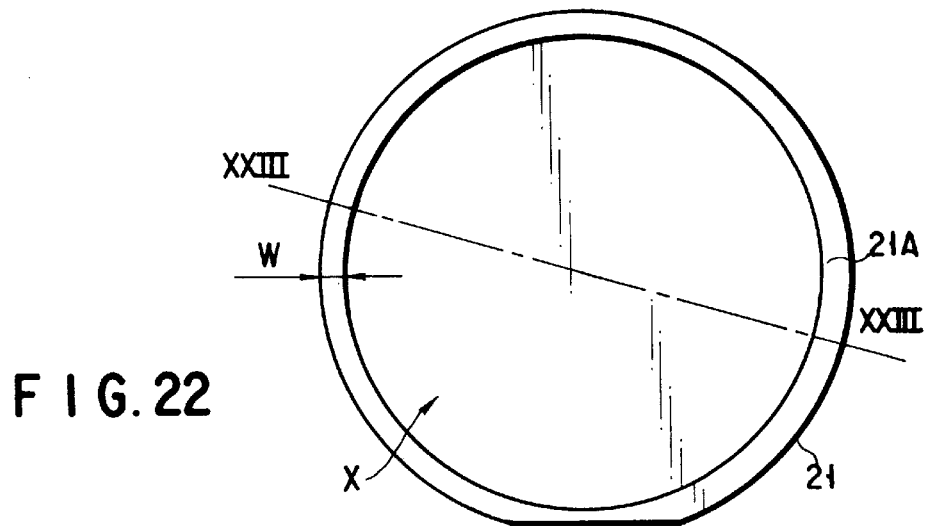
FIG. 22 is a view showing a second example of a semiconductor wafer of this invention.
Figure 23:
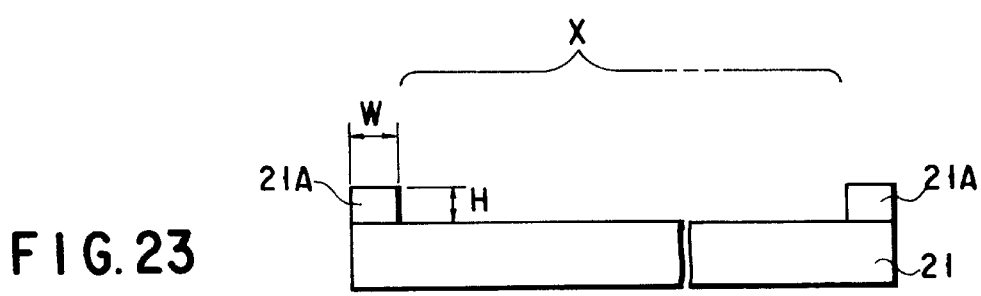
FIG. 23 is a cross sectional view taken along the line XXIIII-XXIII of FIG. 22.

[B] FIGS. 22 and 23 show a second example of the semiconductor wafer of this invention.

A convex portion 21A is formed in an area extending along the edge of a wafer 21 on the main surface (the surface on which elements are formed) side of the wafer 21, that is, in an area inwardly extending from the edge of the wafer 21 to a position in front of a chip region (element region) X by a preset distance (several mm maximum).

A material forming the convex portion 21A is not particularly limited, but the convex portion 21A may be preferably formed of a material (having a higher selective ratio) having a polishing rate different from that of an insulating film to be subjected to CMP.

For example, when the convex portion 21A is formed of silicon, the convex portion 21A may be formed of an epitaxial layer of the wafer (silicon).

The height H and the width W of the convex portion 21A are set to preset values according to various parameters such as the elastic stress of the polishing pad, the semiconductor manufacturing process, and the type, structure and size of elements formed on the wafer, and the height H is roughly set in a range of $0.1 \leq H \leq 100$ $\mu$m and the width W is set in a range of $0 \leq W \leq 2$ to 5 mm (the width from the edge to the chip region).

The specific dimensions of the convex portion 21A are explained in an embodiment described later. The wafer 21 may be a wafer formed of semiconductor such as silicon or GaAs (gallium arsenide) or a wafer having an SOI (Silicon On Insulator) structure such as SIMOX (Separation By Implanted Oxygen).

Since the heavy load in the wafer edge portion caused by the elastic stress of the polishing pad is applied to the convex portion 21A formed on the edge portion of the wafer 21 when the semiconductor wafer with the above structure is used, the wafer edge over-polishing will not occur even if the CMP process is used in the semiconductor manufacturing process.

That is, since the heavy load in the wafer edge portion is applied only to the convex portion 21A, no influence is given to the chip region (element region) X lying on the inner side from the convex portion, and therefore, a high yield can be attained in the semiconductor manufacturing process.

Next, a method for manufacturing the semiconductor wafer shown in FIGS. 22 and 23 is explained.

Figure 24:
FIG. 24 is a cross sectional view showing one step in the semiconductor wafer manufacturing method of FIG. 22.

First, as shown in FIG. 24, a normal wafer (silicon wafer) 21 with a thickness of 600 to 700 µm is subjected to the thermal oxidation process to form an oxide film 31 with a thickness of approx. 0.01 µm on the entire surface (both surfaces, side surfaces) of the wafer 21.

Figure 25:
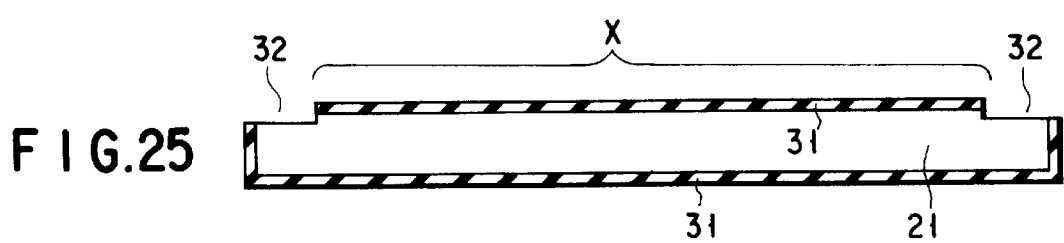
FIG. 25 is a cross sectional view showing one step in the semiconductor wafer manufacturing method of FIG. 22.

Next, as shown in FIG. 25, part of the oxide film 31 which lies on an area with a preset width (the area must be outside the chip region X) from the edge of the wafer 21 is removed on the main surface (on which elements are formed) side of the wafer 21 so as to form a wafer exposing portion 32 along the edge portion of the wafer 21. Removing of the oxide film 31 can be attained by use of a polishing processing method, or photolithography and RIE, for example.

When the oxide film 31 is removed, the wafer 21 may be slightly removed in some cases.

Figure 26:
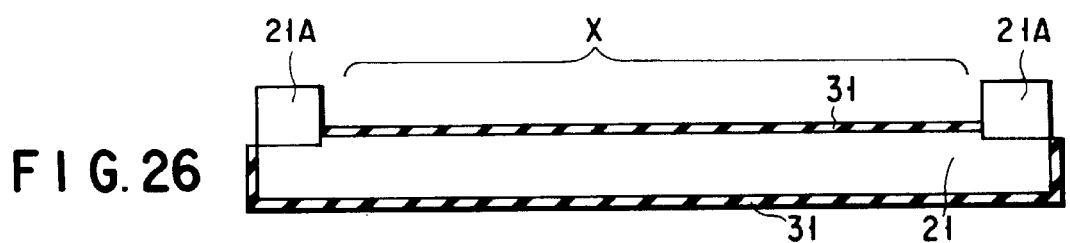
FIG. 26 is a cross sectional view showing one step in the semiconductor wafer manufacturing method of FIG. 22.

Next, as shown in FIG. 26, an epitaxial layer (silicon layer) is grown only in the wafer exposing port on 32 by the epitaxial growth method. As a result, a ring-form convex portion 21A of epitaxial layer is formed on the edge portion of the wafer 21.

Then, as shown in FIG. 27, the oxide film lying on both surfaces and side surfaces of the wafer 21 is removed to complete the wafer 21 having the ring-form convex portion 21A.

In the above manufacturing method, the oxide film 31 is formed by use of the thermal oxidation method, but the method is not limited to the thermal oxidation method and a method such as an LPCVD method can be used if the method can be used to form an oxide film on both surfaces of the wafer 21.

Next, a case wherein the CMP process is applied to a semiconductor device using the above semiconductor wafer is explained.

(a) First Example

This embodiment relates to the CMP process used as the planarization method for making flat the irregular surface portion of the insulating film on the wiring.

First, as shown in FIG. 28, a wafer (silicon wafer) 21 with a thickness of 600 to 700 µm having a convex portion 21A formed along the edge thereof is prepared. The height H of the convex portion 21A is set such that the upper surface of the convex portion 21A is set at substantially the same level (for example, approx. 0.04 µm) as the surface of the insulating film obtained after the end of CMP. The width W of the convex portion 21A is set to a value (for example, which is equal to or smaller than 2 mm, and preferably, 0.5 to 1.5 mm) smaller than the width from the wafer edge to the chip region.

Next, an insulating film (silicon oxide film) 22 is formed on the main surface of the wafer 21 by the thermal oxidation method, for example. Further, a plurality of wirings 23 formed of a conductive material such as polysilicon containing impurity, aluminum or copper are formed on the insulating film 22 by a known method.

After this, an insulating film (BPSG film, TEOS film or the like) 24 for completely covering the plurality of wirings 23 is formed with a film thickness of approx. 1 µm on the insulating film 22 by the LPCVD method, for example. The insulating film 24 may be an LPD (liquid phase deposition)-$SiO_2$ film containing fluorine and formed by the liquid phase growth method. In this case, the surface of the insulating film 24 is made irregular because of the presence of the underlying wirings 23.

Therefore, the insulating film 24 is polished to a portion indicated by broken lines by CMP. When the CMP process is effected, a hard polishing pad of resin or the like and a slurry (polishing solvent) containing polishing particles such as cerium oxide (CeO) or ceria are used.

FIG. 29 shows the state obtained after the end of the CMP process. As is clearly seen from FIG. 29, the over-polishing does not occur in the edge of the wafer 21 and the flatness of the insulating film 24 after the end of the CMP process is improved.

That is, this embodiment is the same as the conventional case in that a local heavy load is applied to the edge portion of the wafer 21 and the polishing rate of the edge portion of the wafer 21 is higher than the polishing rate of the central portion of the wafer 21.

However, in this invention, since the convex portion 21A is formed to previously set the height of part of the insulating film 24 which lies on the edge portion of the wafer 21 larger than that of part of the insulating film 24 which lies on the central portion of the wafer 21, the surface of part of the insulating film 24 which lies on the edge portion of the wafer 21 can be set to the same height as the surface of part of the insulating film 24 which lies on the central portion of the wafer 21 after the end of the CMP process.

If the materials of the wafer 21 and the insulating film 24 have a high selective ratio with respect to the polishing rate of CMP, the high-degree flatness of the insulating film 24 can always be attained in the chip region (element region) X by setting the height H of the convex portion 21A such that the upper surface of the convex portion 21A will become equal to or higher than the surface of the insulating film after the end of CMP.

(b) Second Example

This embodiment relates to the CMP process applied to an STI process for filling an insulating film only in trenches formed in the wafer.

First, as shown in FIG. 30, a wafer (silicon wafer) 21 with a thickness of 600 to 700 µm having a convex portion 21A formed along the edge thereof is prepared. The height H of the convex portion 21A is set to a preset value (for example, approx. 0.4 µm) and the width W of the convex portion 21A is set to a value (for example, which is equal to or smaller than 2 mm, and preferably, 0.5 to 1.5 mm) smaller than the width from the wafer edge to the chip region.

Next, an oxide film (silicon oxide film) 27 with a thickness of approx. 0.01 µm is formed on the main surface of the wafer 21 by the thermal oxidation method, for example. Further, a polysilicon film 28 with a thickness of approx. 0.1 µm is formed on the oxide film 27 by use of the LPCVD method, for example.

Further, a resist pattern is formed on the polysilicon film 28 by the photolithography process. The wafer 21, oxide film 27 and polysilicon film 28 are selectively etched by anisotropic etching (such as RIE) with the resist pattern used as a mask so as to form a plurality of trenches 29. After this, the resist pattern is removed.

Further, an insulating film (such as a TEOS film) 30 used for completely filling the plurality of trenches 29 is formed to a thickness of approx. 1 µm on the polysilicon film 28 by the LPCVD method, for example.

Next, the insulating film 30 is polished by CMP so that the insulating film will be left behind only in the trenches 29. When the CMP process is effected, a hard polishing pad of resin or the like and a slurry (polishing solvent) containing polishing particles such as cerium oxide (CeO) or ceria are used.

Figure 31:
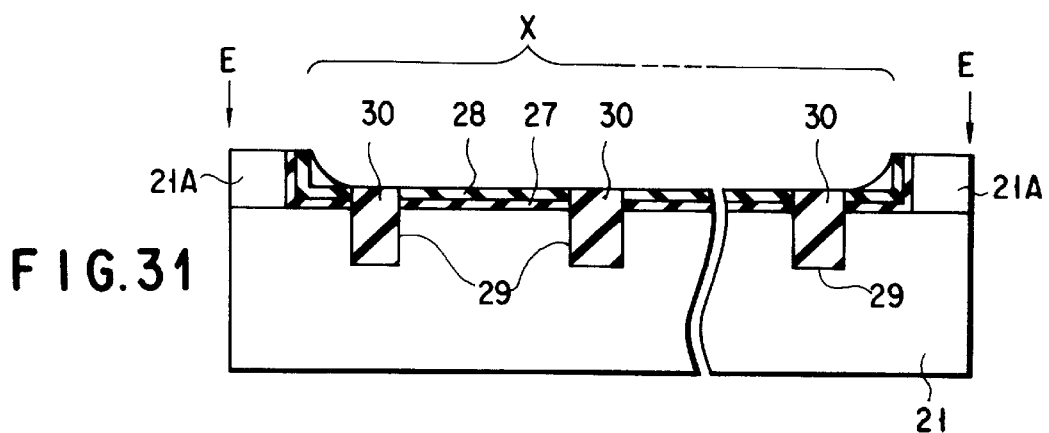
FIG. 31 is a cross sectional view showing the structure of the semiconductor device of FIG. 30 after CMP.

FIG. 31 shows the state obtained after the end of the CMP process. As shown in FIG. 31, the over-polishing does not occur in the edge of the wafer 21 and the convex portion 21A of the wafer 21 is left behind substantially as it is. That is, the insulating film 30 can be filled only in the trenches 29 to complete the STI structure while preventing occurrence of the wafer edge over-polishing.

In this embodiment, the height of the convex portion 21A is set to such a value that the convex portion 21A will be left behind after the end of the CMP process. That is, occurrence of edge drooping which may occur in a range of 10 mm maximum from the edge of the wafer 21 can be effectively prevented because of the presence of the convex portion 21A even if a local heavy load is applied to the edge portion of the wafer 21 at the time of CMP.

If the materials of the wafer 21 and the insulating film 30 have a high selective ratio with respect to the polishing rate of CMP, the height of the convex portion 21A can be set to a relatively small value.

Figure 32:
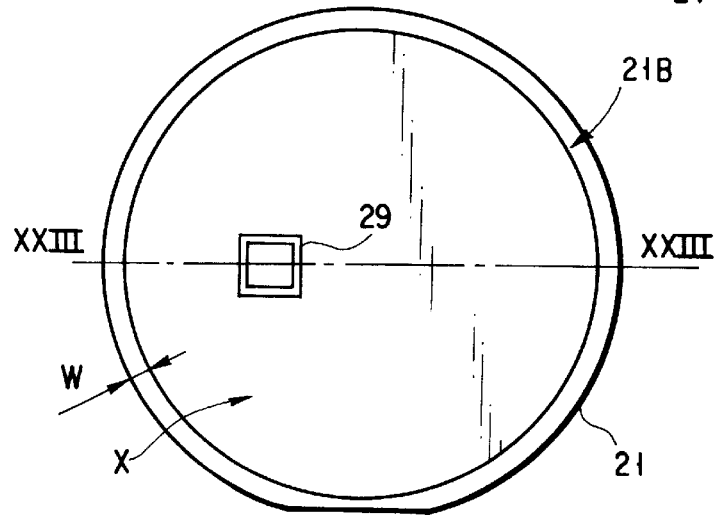
FIG. 32 is a plan view showing a third example of a semiconductor wafer.
Figure 33:
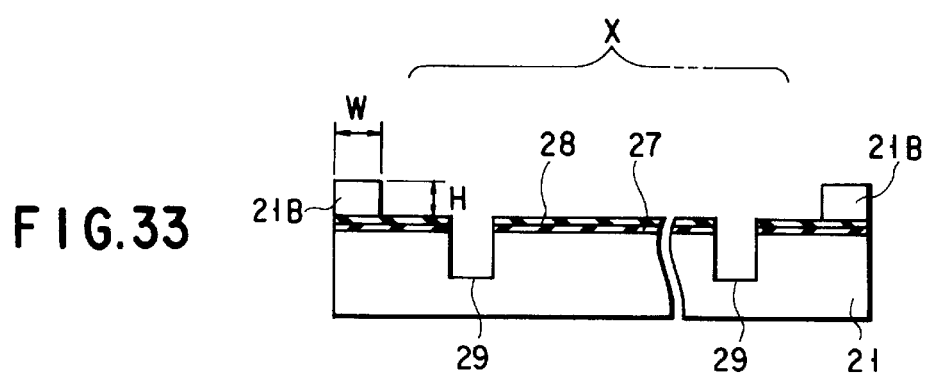
FIG. 33 is a cross sectional view taken along the line XXXIII—XXXIII of FIG. 32.

[C] FIGS. 32 and 33 show an example of the semiconductor device (wafer) of this invention.

An oxide film 27 and polysilicon film 28 are formed on a wafer 21. A plurality of trenches 29 are formed in the wafer 21, oxide film 27 and polysilicon film 28 in a chip region of the wafer 21.

A convex portion 21B is formed in an area extending along the edge of the wafer 21, that is, in an area inwardly extending from the edge of the wafer 21 to a position in front of the chip region by a preset distance (several mm maximum).

A material forming the convex portion 21B is not particularly limited, but the convex portion 21B may be preferably formed of a material (having a higher selective ratio) having a polishing rate different from that of an insulating film to be subjected to CMP.

For example, if the insulating film polished by CMP is a BPSG film, TEOS film or the like, the convex portion 21B is formed of polysilicon, silicon nitride (SiN), carbon (C), tungsten (W), tungsten silicide, titanium (Ti), or titanium silicide.

The height H and the width W of the convex portion 21B are set to preset values according to various parameters such as the elastic stress of the polishing pad, the semiconductor manufacturing process, and the type, structure and size of elements formed on the wafer, and the height H is roughly set in a range of $0.1 \leq H \leq 100$ µm and the width W is set in a range of $0 \leq W \leq 2$ to 5 mm (the width from the edge to the chip region).

The wafer 21 may be a wafer formed of semiconductor such as silicon or GaAs (gallium arsenide) or a wafer having an SOI (Silicon On Insulator) structure such as SIMOX (Separation By Implanted Oxygen).

Since the heavy load in the wafer edge portion caused by the elastic stress of the polishing pad is applied to the convex portion 21B formed on the edge portion of the wafer 21 when the semiconductor device with the above structure is used, the wafer edge over-polishing will not occur even if the CMP process is used in the STI process, for example.

That is, since the heavy load in the wafer edge portion is applied only to the convex portion. 21B, no influence is given to the chip region (element region) X lying on the inner side from the convex portion, and therefore, a high yield can be attained in the semiconductor manufacturing process.

The convex portion 21B can be easily formed by photolithography and RIE.

Next, a case wherein the CMP process is applied to the semiconductor device shown in FIGS. 32 and 33 is explained.

This example relates to the CMP process applied to the STI process for filling an insulating film only in trenches formed in the wafer.

Figure 34:
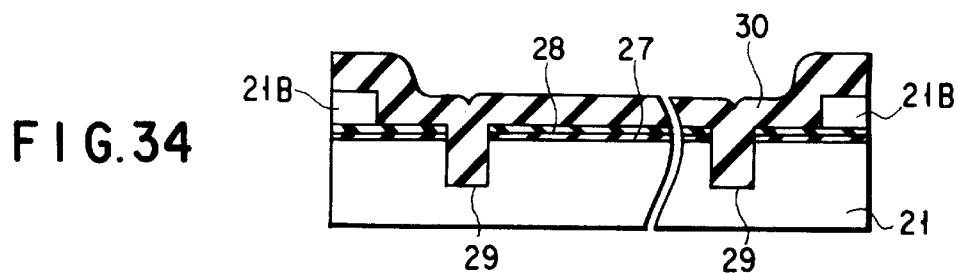
FIG. 34 is a cross sectional view showing a state in which an STI is formed on the semiconductor wafer of FIG. 32.

First, as shown in FIG. 34, an oxide film (silicon oxide film) 27 with a thickness of approx. 0.01 µm is formed on the main surface of a normal wafer (silicon wafer) 21 with a thickness of 600 to 700 µm by the thermal oxidation method, for example. Then, a polysilicon film 28 with a thickness of approx. 0.1 µm is formed on the oxide film 27 by the LPCVD method, for example.

Further, a resist pattern is formed on the polysilicon film 28 by the photolithography process. The wafer 21, oxide film 27 and polysilicon film 28 are selectively etched by anisotropic etching (such as RIE) with the resist pattern used as a mask so as to form a plurality of trenches 29. After this, the resist pattern is removed.

Then, a polysilicon film is formed on the polysilicon film 28 by the LPCVD method and the upper polysilicon film is left behind along the edge of the wafer 21 by photolithography and RIE. As a result, a ring-form convex portion 21B is formed on the edge portion of the wafer 21.

The height H of the convex portion 21B is set to a preset value (for example, approx. 0.4 µm) and the width W of the convex portion 21B is set to a value (for example, which is equal to or smaller than 2 mm, and preferably, 0.5 to 1.5 mm) smaller than the width from the wafer edge to the chip region.

It is possible to exchange the step of forming the trenches 29 and the step of forming the convex portion 21B for one another. That is, the trenches 29 may be formed after the convex portion 21B is formed along the edge of the wafer 21.

After this, an insulating film (TEOS film or the like) 30 for completely filling the plurality of trenches 29 is formed to a film thickness of approx. 1 µm on the polysilicon film 28 by the LPCVD method, for example.

Figure 35:
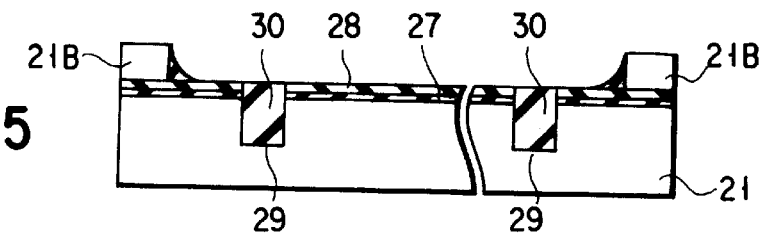
FIG. 35 is a cross sectional view showing a state in which an STI is formed on the semiconductor wafer of FIG. 32.

Next, as shown in FIG. 35, the insulating film 30 is polished by CMP so that the insulating film will be left behind only in the trenches 29. When the CMP process is effected, a hard polishing pad of resin or the like and a slurry (polishing solvent) containing polishing particles such as cerium oxide (CeO) or ceria are used.

According to this embodiment, the over-polishing does not occur in the edge of the wafer 21 and the convex portion 21B of the wafer 21 is left behind substantially as it is. That is, the insulating film 30 can be filled only in the trenches 29 while preventing occurrence of the wafer edge overpolishing.

Further, the height of the convex portion 21B is set to such a value that the convex portion 21B will be left behind after the end of the CMP process. That is, occurrence of edge drooping which may occur in a range of 10 mm maximum from the edge of the wafer 21 can be effectively prevented because of the presence of the convex portion 21B even if a local heavy load is applied to the edge portion of the wafer 21 at the time of CMP.

If the materials of the wafer 21 and the insulating film 30 have a high selective ratio with respect to the polishing rate of CMP, the height of the convex portion 21B can be set to a relatively small value.

Figure 36:
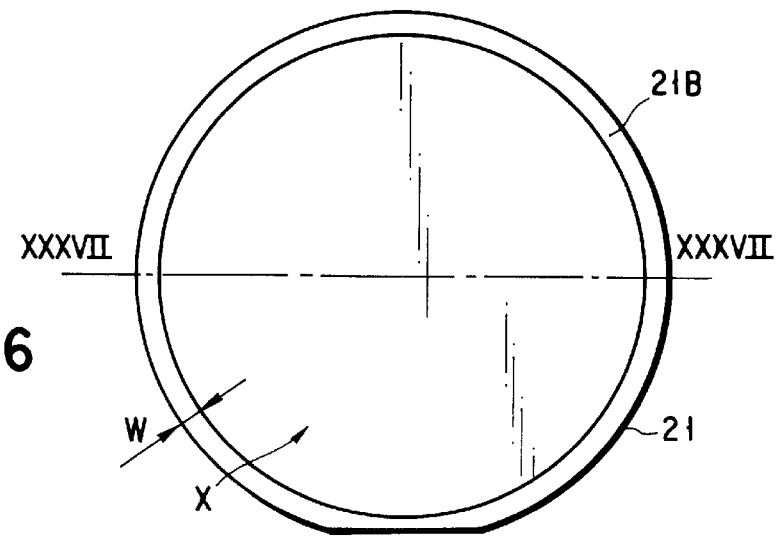
FIG. 36 is a plan view showing an example of a semiconductor device of this invention.
Figure 37:
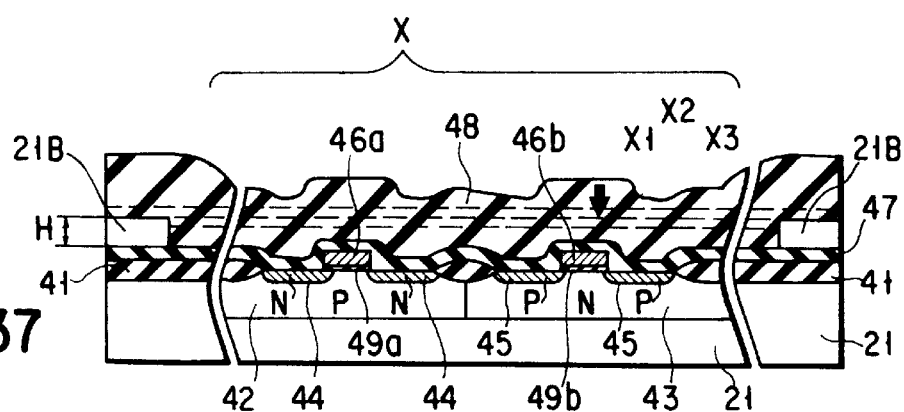
FIG. 37 is a cross sectional view taken along the line XXXVII—XXXVII of FIG. 36.

[D] FIGS. 36 and 37 show an example of the semiconductor device of this invention.

A field oxide film ($SiO_2$ film) 41 is formed on the main surface of a wafer 21. A P-type well region 42 and N-type well region 43 are formed on the wafer 21 in a chip region X which lies in the central portion of the wafer 21.

An N-channel MOS transistor is formed in the P-type well region 42. The N-channel MOS transistor is formed of N-type diffusion layers (source/drain regions) 44 formed in the P-type well region 42 and a gate electrode 46a formed above a channel region between the diffusion regions 44 with a gate oxide film 49a disposed therebetween.

Likewise, a P-channel MOS transistor is formed in the N-type well region 43. The P-channel MOS transistor is formed of P-type diffusion layers (source/drain regions) 45 formed in the N-type well region 43 and a gate electrode 46b formed above a channel region between the diffusion regions 45 with a gate oxide film 49b disposed therebetween.

A silicon oxide film ($SiO_2$ film) 47 is formed to a thickness of approx. 0.2 $\mu$m on the field oxide film 41 and MOS transistors by the LPCVD method so as to completely cover the field oxide film 41 and MOS transistors.

A convex portion 21B is formed in an area extending along the edge of the wafer 21 on the silicon oxide film 47, that is, in an area inwardly extending from the edge of the wafer 21 to a position in front of the chip region (element region) X by a preset distance (several mm maximum).

Further, an insulating film 48 with a film thickness of approx. 1 $\mu$m is formed on the silicon oxide film 47 and convex portion 21B. The insulating film 48 is formed of a BPSG film, TEOS film, LPD-$SiO_2$ film or the like.

A material forming the convex portion 21B is not particularly limited, but the convex portion 21B may be preferably formed of a material (having a higher selective ratio) having a polishing rate different from that of the insulating film 48 to be subjected to CMP.

For example, if the insulating film 48 polished by CMP is a BPSG film, TEOS film or the like, the convex portion 21B is formed of polysilicon, silicon nitride (SiN), carbon (C), tungsten (W), tungsten silicide, titanium (Ti), or titanium silicide.

The height H and the width W of the convex portion 21B are set to preset values according to various parameters such as the elastic stress of the polishing pad, the semiconductor manufacturing process, and the type, structure and size of elements formed on the wafer, and the height H is roughly set in a range of $0.1 \leq H \leq 100$ $\mu$m and the width W is set in a range of $0 \leq W \leq 2$ to 5 mm (the width from the edge to the chip region).

The wafer 21 may be a wafer formed of semiconductor such as silicon or GaAs (gallium arsenide) or a wafer having an SOI (Silicon On Insulator) structure such as SIMOX (Separation By Implanted Oxygen).

Since the heavy load in the wafer edge portion caused by the elastic stress of the polishing pad is applied to the convex portion 21B formed on the edge portion of the wafer 21 when the semiconductor device with the above structure is used, the wafer edge over-polishing will not occur even if the CMP process is used in the semiconductor manufacturing process, for example.

Further, since the heavy load in the wafer edge portion is applied only to the convex portion 21B, no influence is given to the chip region (element region) X lying on the inner side from the convex portion. Therefore, a high yield can be attained in the semiconductor manufacturing process by using the semiconductor device of this invention.

If the materials of the convex portion 21B and the insulating film 48 have a sufficiently high selective polishing ratio with respect to CMP, the convex portion 21B is not polished to a large extent even when the polishing process by CMP proceeds as indicated by broken lines X1 to X3, and thus, occurrence of the over-polishing in the edge portion of the wafer 21 can be effectively prevented.

Next, a method for manufacturing the semiconductor device of this invention of FIGS. 36 and 37 is explained.

Figure 38:
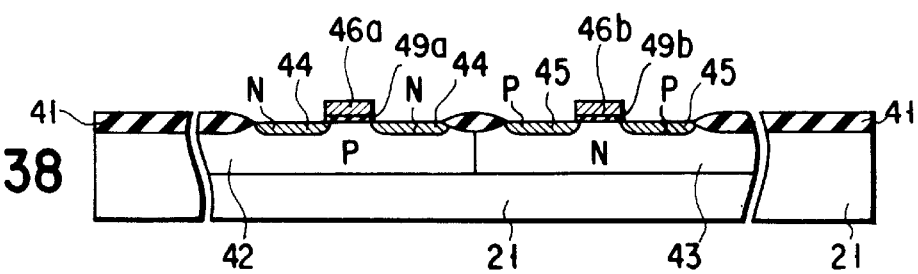
FIG. 38 is a cross sectional view showing one step in the semiconductor device manufacturing method of FIG. 36.

First, as shown in FIG. 38, P-type impurity and N-type impurity are doped into a normal wafer (silicon wafer) 21 with a thickness of 600 to 700 $\mu$m to form a P-type well region 42 and N-type well region 43. Then, a field oxide film ($SiO_2$ film) 41 is formed on the wafer 21 by use of the selective oxidation method.

Further, impurities for controlling the threshold voltages of MOS transistors are implanted into the P-type well region 42 and N-type well region 43 by the ion-implantation technique. After gate oxide films 49a, 49b are formed by the thermal oxidation method, a polysilicon film with a thickness of approx. 0.3 $\mu$m is formed on the gate oxide films 49a, 49b by the LPCVD method.

Then, a $POCl_3$ atmosphere is created and N-type impurity (P) is diffused into the polysilicon film to make the polysilicon film conductive. After this, the polysilicon film is processed by photolithography and RIE to form gate electrodes 46a, 46b.

Further, N-type impurity is implanted into the P-type well region 42 and P-type impurity is implanted into the N-type well region 43 by the ion-implantation technique. Thus, N-channel and P-channel MOS transistors are formed.

Figure 39:
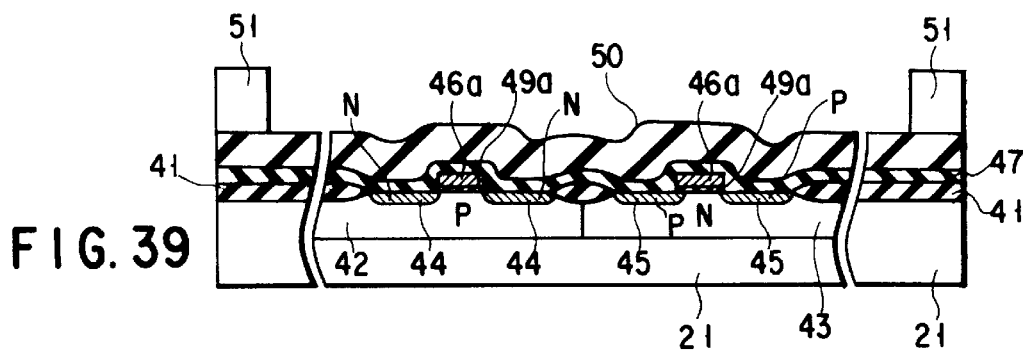
FIG. 39 is a cross sectional view showing one step in the semiconductor device manufacturing method of FIG. 36.

Next, as shown in FIG. 39, a silicon oxide film ($SiO_2$ film) 47 is formed to a thickness of approx. 0.2 $\mu$m on the field oxide film 41 and the MOS transisters to cover the field oxide film 41 and the MOS transistors.

Then, a film of a material having a selective ratio different from that of a BPSG film, for example, with respect to the polishing rate of CMP, for example, a polysilicon film 50 is formed on the silicon oxide film 47 by the LPCVD method. The thickness of the polysilicon film 50 is set to such a value (for example, approx. 0.8 $\mu$m) that the upper surface thereof will become equal in height to the upper surface of the BPSG film after the end of the CMP process.

After this, a resist pattern 51 is left behind in a ring form in an area along the edge portion of the wafer 21 on the polysilicon film 50 by photolithography.

Figure 40:
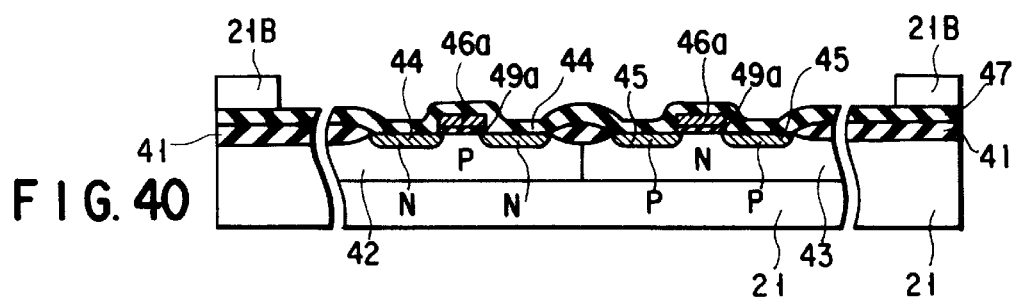
FIG. 40 is a cross sectional view showing one step in the semiconductor device manufacturing method of FIG. 36.

Next, as shown in FIG. 40, the polysilicon film 50 is etched by CDE (chemical dry etching) or RIE with the resist pattern 51 used as a mask to leave the polysilicon film 50 behind only on the edge portion of the wafer 21, thus forming a convex portion 21B. Then, the resist pattern 51 is removed.

Next, as shown in FIG. 37, an insulating film (such as a BPSG film) 48 is formed to a thickness of approx. 1 $\mu$m on the silicon oxide film 47 and convex portion 21B by the LPCVD method to completely cover the silicon oxide film and convex portion.

After this, the CMP process is effected to make the surface of the insulating film 48 flat.

Next, a concrete example of the semiconductor device shown in FIGS. 36 and 37 is explained.

A wafer (silicon wafer) 21 with a thickness of 600 to 700 $\mu$m is used. The height H of the convex portion 21B is set to such a value that the upper surface of the convex portion 21B is set at substantially the same level (for example, approx. 0.4 $\mu$m) as the surface of the insulating film 48 after the end of CMP. Further, the width W of the convex portion 21B is set to a value (for example, which is equal to or smaller than 2 mm, and preferably, 0.5 to 1.5 mm) smaller than the width from the wafer edge to the chip region.

A BPSG film with a film thickness of approx. 1 $\mu$m is used as the insulating film 48 and a polysilicon film is used to form the convex portion 21B.

When the CMP process is effected, a hard polishing pad of resin or the like and a slurry (polishing solvent) containing polishing particles such as cerium oxide (CeO) or ceria are used.

If the insulating film 48 is polished by approx. 0.6 $\mu$m under the above condition, a local heavy load is applied to the edge portion of the wafer 21 during the polishing process and the polishing rate of the edge portion of the wafer 21 becomes higher than the polishing rate of the central portion of the wafer 21.

In this case, since the convex portion 21B is formed on the edge of the wafer 21, the surface of the insulating film 48 on the convex portion 21B is set at a level higher than the surface of the insulating film on the central portion of the wafer 21. Therefore, even if the polishing rate of the edge portion of the wafer 21 is high, the over-polishing of the insulating film 48 will not occur on the edge portion of the wafer 21 after the end of CMP and the surface flatness of the insulating film 48 can be improved (broken lines X1, X2 in FIG. 37).

Further, even if the insulating film 48 on the edge portion of the wafer 21 is completely polished, the polishing process will not further proceed in the edge portion of the wafer 21 since the polishing rate of CMP for the convex portion 21B is low in comparison with that for the insulating film 48, and as a result, occurrence of the over-polishing in the edge portion of the wafer 21 can be prevented (broken lines X3 in FIG. 37).

Figure 41:
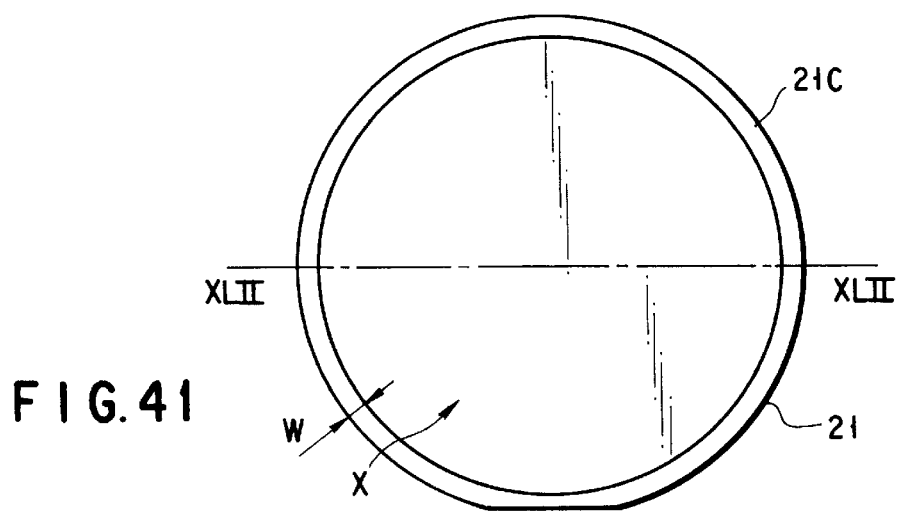
FIG. 41 is a plan view showing an example of a semiconductor device of this invention.
Figure 42:
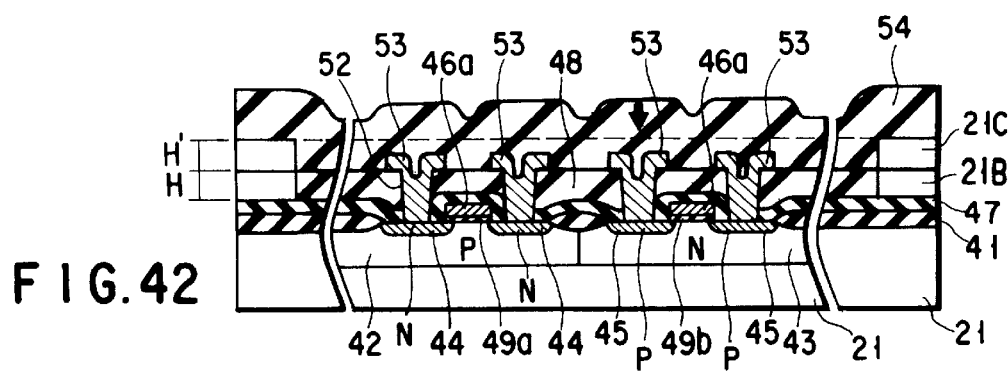
FIG. 42 is a cross sectional view taken along the line XLII—XLII of FIG. 41.

[E] FIGS. 41 and 42 show an example of the semiconductor device of this invention.

A field oxide film ($SiO_2$ film) 41 is formed on the main surface of a wafer 21. A P-type well region 42 and N-type well region 43 are formed on the wafer 21 in a chip region X which lies in the central portion of the wafer 21.

An N-channel MOS transistor is formed in the P-type well region 42. The N-channel MOS transistor is formed of N-type diffusion layers (source/drain regions) 44 formed in the P-type well region 42 and a gate electrode 46a formed above a channel region between the diffusion regions 44 with a gate oxide film 49a disposed therebetween.

Likewise, a P-channel MOS transistor is formed in the N-type well region 43. The P-channel MOS transistor is formed of P-type diffusion layers (source/drain regions) 45 formed in the N-type well region 43 and a gate electrode 46b formed above a channel region between the diffusion regions 45 with a gate oxide film 49b disposed therebetween.

A silicon oxide film ($SiO_2$ film) 47 is formed with a thickness of approx. 0.2 $\mu$m on the field oxide film 41 and MOS transistors by the LPCVD method so as to completely cover the field oxide film 41 and MOS transistors.

A convex portion 21B is formed in an area extending along the edge of the wafer 21 on the silicon oxide film 47, that is, in an area inwardly extending from the edge of the wafer 21 to a position in front of the chip region (element region) X by a preset distance (several mm maximum).

Further, an insulating film 48 with a film thickness of approx. 0.4 $\mu$m is formed on the silicon oxide film 47. The insulating film 48 is formed of a BPSG film, TEOS film, LPD (Liquid Phase Deposition)-$SiO_2$ film or the like.

The surface of the insulating film 48 is made flat by CMP and the height of the surface of the insulating film 48 almost coincides with the height of the surface of the convex portion 21B.

Contact holes 52 extending from the surface of the insulating film 48 to the diffusion layers 44, 45 are formed in the insulating films 47, 48. Further, wirings 53 are formed on the insulating film 48 and the wirings 48 are connected to the diffusion layers 44, 45 via the contact holes 52.

A convex portion 21C is formed on the convex portion 21B in the edge portion of the wafer 21. A material forming the convex portion 21C is not particularly limited, but the convex portion 21C may be preferably formed of a material (having a higher selective ratio) having a polishing rate different from that of the insulating film 54 to be subjected to CMP.

For example, if the insulating film 54 polished by CMP is a BPSG film, TEOS film or the like, the convex portion 21C is formed of polysilicon, silicon nitride (SiN), carbon (C), tungsten (W), tungsten silicide, titanium (Ti), or titanium silicide.

The height H' and the width W of the convex portion 21C are set to preset values according to various parameters such as the elastic stress of the polishing pad, the semiconductor manufacturing process, and the type, structure and size of elements formed on the wafer, and the height H' is roughly set in a range of $0.1 \leq H' \leq 100$ $\mu$m and the width W is set in a range of $0 \leq W \leq 2$ to 5 mm (the width from the edge to the chip region).

The wafer 21 may be a wafer formed of semiconductor such as silicon or GaAs (gallium arsenide) or a wafer having an SOI (Silicon On Insulator) structure such as SIMOX (Separation By Implanted Oxygen).

Since the heavy load in the wafer edge portion caused by the elastic stress of the polishing pad is applied to the convex portions 21B, 21C formed on the edge portion of the wafer 21 when the semiconductor device with the above structure is used, the wafer edge over-polishing will not occur even if the CMP process is used in the semiconductor manufacturing process.

Further, since the heavy load in the wafer edge portion is applied to the convex portions 21B, 21C, no influence is given to the chip region (element region) X lying on the inner side from the convex portion, and therefore, a high yield can be attained in the semiconductor manufacturing process.

If the materials of the convex portion 21C and the insulating film 54 have a sufficiently high selective polishing ratio with respect to CMP, the convex portion 21C is not polished to a large extent even when the polishing process by CMP proceeds, and thus, occurrence of the over-polishing in the edge portion of the wafer 21 can be effectively prevented.

Next, a concrete example of the semiconductor device of FIGS. 41 and 42 is explained.

A wafer (silicon wafer) 21 with a thickness of 600 to 700 $\mu$m is used. The upper surface of the insulating film 48 is made flat by CMP and the upper surface of the convex portion 21B almost coincides with the upper surface of the insulating film 48. The wirings 53 may be formed of a polysilicon film containing impurity, or a metal film of copper or aluminum. The wirings 53 may contain barrier metal.

The height H' of the convex portion 21C is set to such a value that the upper surface of the convex portion 21B may be set at substantially the same level (for example, approx. 0.4 $\mu$m) as the surface of the insulating film 54 after the end of CMP. Further, the width W of the convex portion 21C is set to a value (for example, which is equal to or smaller than 2 mm, and preferably, 0.5 to 1.5 mm) smaller than the width from the wafer edge to the chip region.

A BPSG film with a film thickness of approx. 1 $\mu$m is used as the insulating film 54 and a polysilicon film is used to form the convex portion 21C.

When the CMP process is effected, a hard polishing pad of resin or the like and a slurry (polishing solvent) containing polishing particles such as cerium oxide (CeO) or ceria are used.

If the insulating film 54 is polished by approx. 0.6 $\mu$m under the above condition, a local heavy load is applied to the edge portion of the wafer 21 during the polishing process and the polishing rate of the edge portion of the wafer 21 becomes higher than the polishing rate of the central portion of the wafer 21.

In this case, since the convex portion 21C is formed on the edge of the wafer 21, the surface of the insulating film 54 on the convex portion 21C is set at the higher level than the surface of the insulating film 54 on the central portion of the wafer 21. Therefore, even if the polishing rate of the edge portion of the wafer 21 is high, the over-polishing of the insulating film 54 will not occur on the edge portion of the wafer 21 after the end of CMP and the surface flatness of the insulating film 54 can be improved (broken lines in FIG. 42).

Further, even if the insulating film 54 on the edge portion of the wafer 21 is completely polished, the polishing process will not further proceed in the edge portion of the wafer 21 since the polishing rate of CMP for the convex portion 21C is low in comparison with that for the insulating film 54, and as a result, occurrence of the over-polishing in the edge portion of the wafer 21 can be prevented.

Figure 43:
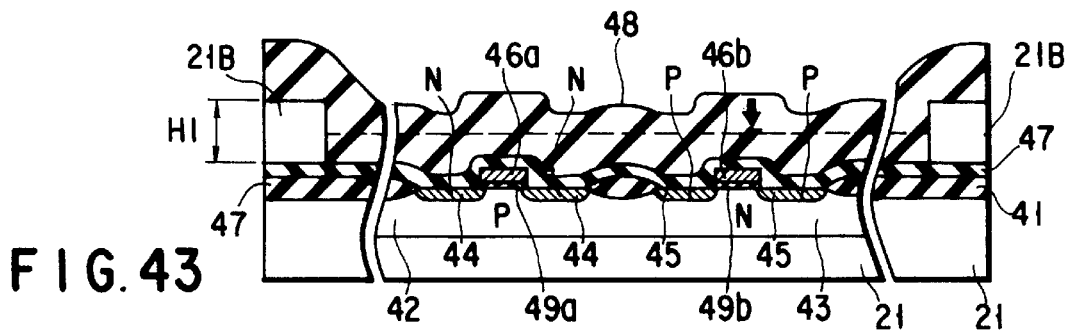
FIG. 43 is a cross sectional view showing an example of a semiconductor device of this invention.

[F] FIG. 43 shows an example of the semiconductor device of this invention.

A field oxide film (SiO$_2$ film) 41 is formed on the main surface of a wafer 21. A P-type well region 42 and N-type well region 43 are formed on the wafer 21 in a chip region X which lies in the central portion of the wafer 21.

An N-channel MOS transistor is formed in the P-type well region 42. The N-channel MOS transistor is formed of N-type diffusion layers (source/drain regions) 44 formed in the P-type well region 42 and a gate electrode 46a formed above a channel region between the diffusion regions 44 with a gate oxide film 49a disposed therebetween.

Likewise, a P-channel MOS transistor is formed in the N-type well region 43. The P-channel MOS transistor is formed of P-type diffusion layers (source/drain regions) 45 formed in the N-type well region 43 and a gate electrode 46b formed above a channel region between the diffusion regions 45 with a gate oxide film 49b disposed therebetween.

A silicon oxide film (SiO$_2$ film) 47 is formed with a thickness of approx. 0.2 $\mu$m on the field oxide film 41 and MOS transistors by the LPCVD method so as to completely cover the field oxide film 41 and MOS transistors.

A convex portion 21B is formed in an area extending along the edge of the wafer 21 on the silicon oxide film 47, that is, in an area inwardly extending from the edge of the wafer 21 to a position in front of the chip region (element region) X by a preset distance (several mm at maximum).

A material forming the convex portion 21B is not particularly limited, but the convex portion 21B may be preferably formed of a material (having a higher selective ratio) having a polishing rate different from that of the insulating film 48 to be subjected to CMP.

For example, if the insulating film 48 polished by CMP is a BPSG film, TEOS film or the like, the convex portion 21B is formed of polysilicon, silicon nitride (SiN), carbon (C), tungsten (W), tungsten silicide, titanium (Ti), or titanium silicide.

The height H1 of the convex portion 21B is set such that the surface level thereof will become higher than the surface level of the insulating film 48 after the end of CMP. The height H1 is roughly set in a range of $0.1 \leq H \leq 100$ $\mu$m. The width W of the convex portion 21B is set in a range of $0 \leq W \leq 2$ to 5 mm (the width from the edge to the chip region).

The wafer 21 may be a wafer formed of semiconductor such as silicon or GaAs (gallium arsenide) or a wafer having an SOI (Silicon On Insulator) structure such as SIMOX (Separation By Implanted Oxygen).

Since the heavy load in the wafer edge portion caused by the elastic stress of the polishing pad is applied to the convex portion 21B formed on the edge portion of the wafer 21 when the semiconductor device with the above structure is used, the wafer edge over-polishing will not occur even if the CMP process is used in the semiconductor manufacturing process.

Further, since the heavy load in the wafer edge portion is applied to the convex portion 21B, no influence is given to the chip region (element region) X lying on the inner side from the convex portion, and therefore, a high yield can be attained in the semiconductor manufacturing process.

If the materials of the convex portion 21B and the insulating film 48 have a sufficiently high selective polishing ratio with respect to CMP, the convex portion 21B is not polished to a large extend even when the polishing process by CMP proceeds, and thus, occurrence of the over-polishing in the edge portion of the wafer 21 can be effectively prevented.

Next, a concrete example the semiconductor device of FIG. 43 is explained.

(a) First Example

This example relates to the CMP process used for making flat the irregular surface portion of the insulating film on the wiring.

Figure 44:
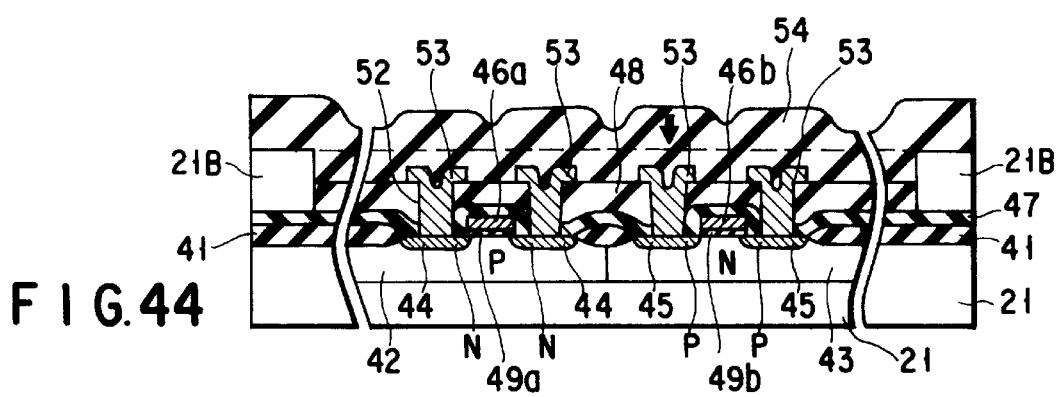
FIG. 44 is a cross sectional view showing an example of a semiconductor device of this invention.

As shown in FIG. 44, a wafer (silicon wafer) 21 with a thickness of 600 to 700 $\mu$m is used. The height H1 of a convex portion 21B is set to such a value (for example, 0.8 $\mu$m) that the upper surface of the convex portion 21B will be set at a level higher than the surface of the insulating film 48 obtained after the end of CMP. The width W of the convex portion 21B is set to a value (for example, which is equal to or smaller than 2 mm, and preferably, 0.5 to 1.5 mm) smaller than the width from the wafer edge to the chip region .

A BPSG film with a film thickness of approx. 1 μm is used as the insulating film 48 and a polysilicon film is used to form the convex portion 21B.

When the CMP process is effected, a hard polishing pad of resin or the like and a slurry (polishing solvent) containing polishing particles such as cerium oxide (CeO) or ceria are used.

If the insulating film 48 is polished by approx. 0.6 μm under the above condition, a local heavy load is applied to the edge portion of the wafer 21 during the polishing process and the polishing rate of the edge portion of the wafer 21 becomes higher than the polishing rate of the central portion of the wafer 21.

In this case, since the convex portion 21B is formed on the edge of the wafer 21, the surface of the insulating film 48 on the convex portion 21B is set at the higher level than the surface of the insulating film 48 on the central portion of the wafer 21. Further, the polishing rate of the convex portion 21B is set lower than the polishing rate of the insulating film 48 with respect to CMP.

Therefore, even if the polishing rate of the edge portion of the wafer 21 is higher than the polishing rate of the central portion of the wafer 21, the polishing process in the edge portion of the wafer 21 is substantially stopped when the convex portion 21B is exposed, and thus, occurrence of the wafer edge over-polishing can be prevented.

After the insulating film 48 is polished by CMP and the surface of the insulating film 48 is made flat, contact: holes 52 are formed in the insulating films 47, 48. Further, after wirings 53 are formed on the insulating film 48 and in the contact holes 52, an insulating film (such as a BPSG film) 54 for completely covering the wirings 53 is formed to a thickness of approx. 1 μm on the insulating film 48 and convex portion 21B.

The wirings 53 may be formed of a polysilicon film containing impurity, or a metal film of copper or aluminum. The wirings 53 may contain barrier metal.

The convex portion 21B is formed to further project from the surface level of the insulating film 48 by approx. 0.4 μm. That is, the height H1 of the convex portion 21B is set such that the upper surface of the convex portion 21B will be set at substantially the same level as the upper surface of the insulating film 54 after the end of CMP. Further, the width W of the convex portion 21B is set to a value (for example, which is equal to or smaller than 2 mm, and preferably, 0.5 to 1.5 mm) smaller than the width from the wafer edge to the chip region.

A BPSG film with a film thickness of approx. 1 μm is used as the insulating film 54. When the CMP process is effected, a hard polishing pad of resin or the like and a slurry (polishing solvent) containing polishing particles such as cerium oxide (CeO) or ceria are used.

If the insulating film 54 is polished by approx. 0.6 μm under the above condition, a local heavy load is applied to the edge portion of the wafer 21 during the polishing process and the polishing rate of the edge portion of the wafer 21 becomes higher than the polishing rate of the central portion of the wafer 21.

In this case, since the convex portion 21B is formed on the edge portion of the wafer 21, the surface of part of the insulating film 54 lying on the convex portion 21B is set at the higher level than the surface of part of the insulating film 54 lying on the central portion of the wafer 21. Therefore, even if the polishing rate of the edge portion of the wafer 21 is high, the over-polishing of the insulating film 54 will not occur on the edge portion of the wafer 21 after the end of CMP and the surface flatness of the insulating film 54 can be improved.

Further, even if the insulating film 54 on the edge portion of the wafer 21 is completely polished, the polishing process will not further proceed in the edge portion of the wafer 21 since the polishing rate of CMP for the convex portion 21B is low in comparison with that for the insulating film 54, and as a result, occurrence of the over-polishing in the edge portion of the wafer 21 can be prevented.

(b) Second Example

This embodiment relates to the CMP process effected when a conductive material is filled only in trenches formed in the dual-damascene method.

Figure 45:
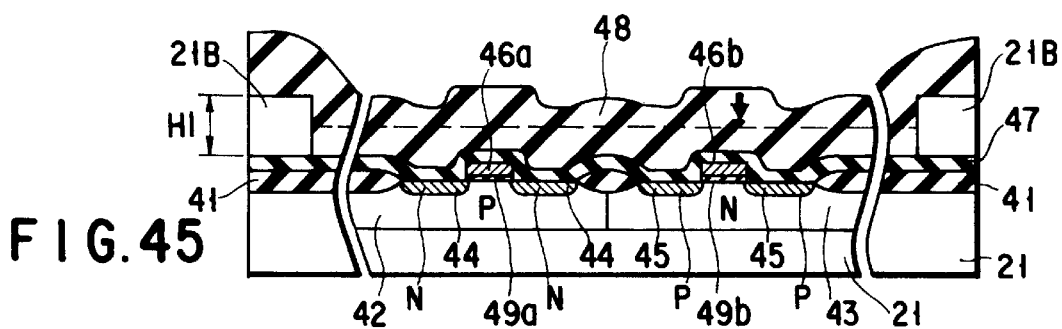
FIG. 45 is a cross sectional view showing an example of a semiconductor device of this invention.

First, as shown in FIG. 45, a wafer (silicon wafer) 21 with a thickness of 600 to 700 μm is used. The height H1 of the convex portion 21B is set to such a value (for example, 0.8 μm) that the upper surface of the convex portion 21B will be set at a level higher than the surface of the insulating film 48 obtained after the end of CMP. The width W of the convex portion 21B is set to a value (for example, which is equal to or smaller than 2 mm, and preferably, 0.5 to 1.5 mm) smaller than the width from the wafer edge to the chip region.

A BPSG film with a film thickness of approx. 1 μm is used as the insulating film 48 and a polysilicon film is used to form the convex portion 21B.

When the CMP process is effected, a hard polishing pad of resin or the like and a slurry (polishing solvent) containing polishing particles such as cerium oxide (CeO) or ceria are used.

If the insulating film 48 is polished by approx. 0.6 μm under the above condition, a local heavy load is applied to the edge portion of the wafer 21 during the polishing process and the polishing rate of the edge portion of the wafer 21 becomes higher than the polishing rate of the central portion of the wafer 21. However, the polishing rate of the convex portion 21B is set to be lower than the polishing rate of the insulating film 48 with respect to CMP.

Therefore, even if the polishing rate of the edge portion of the wafer 21 is higher than the polishing rate of the central portion of the wafer 21, the polishing process in the edge portion of the wafer 21 is substantially stopped when the convex portion 21B is exposed, and thus, occurrence of the wafer edge over-polishing can be prevented.

Figure 46:
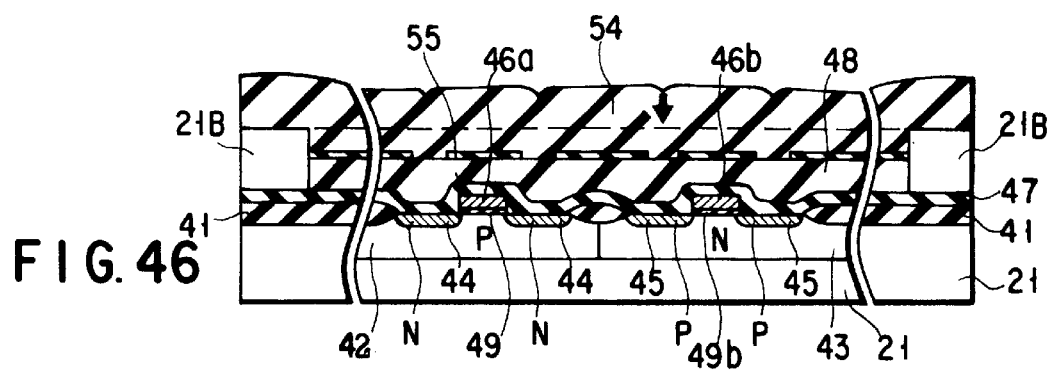
FIG. 46 is a cross sectional view showing an example of a semiconductor device of this invention.

Next, as shown in FIG. 46, an etching stopper film 55 is formed on the insulating film 48 by the LPCVD method. The etching stopper film 55 is formed of an insulating film such as a silicon nitride film and has openings formed in positions above the diffusion layers 44, 45.

An insulating film (such as a BPSG film) 54 is formed to a thickness of approx. 1 μm on the etching stopper film 55. After this, the CMP process is effected to make the surface of the insulating film 54 flat. When the CMP process is effected, a hard polishing pad of resin or the like and a slurry (polishing solvent) containing polishing particles such as cerium oxide (CeO) or ceria are used.

If the insulating film 54 is polished by approx. 0.6 μm under the above condition, a local heavy load is applied to the edge portion of the wafer 21 during the polishing process and the polishing rate of the edge portion of the wafer 21 becomes higher than the polishing rate of the central portion of the wafer 21. However, the polishing rate of the convex portion 21B is set to be lower than the polishing rate of the insulating film 54 with respect to CMP.

Therefore, even if the polishing rate of the edge portion of the wafer 21 is higher than the polishing rate of the central portion of the wafer 21, the polishing process in the edge portion of the wafer 21 is substantially stopped when the convex portion 21B is exposed, and thus, occurrence of the wafer edge over-polishing can be prevented.

Various conditions are set such that the height of the surface of the convex portion 21B is set substantially equal to the height of the surface of the insulating film 54 after the end of CMP.

Figure 47:
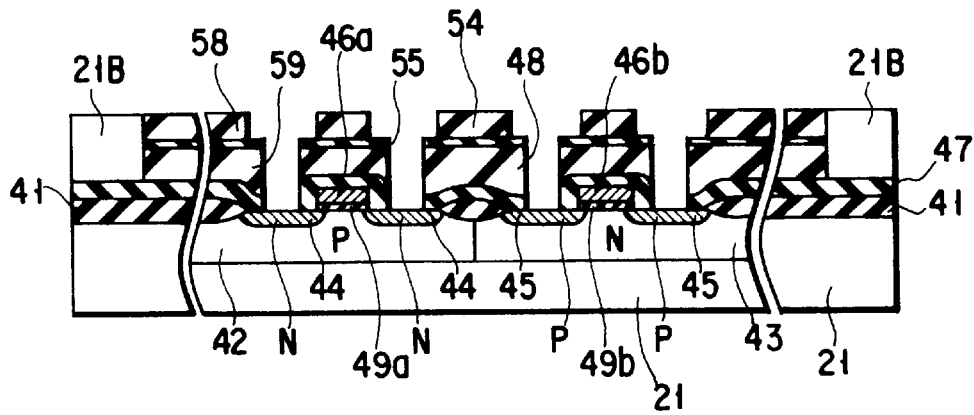
FIG. 47 is a cross sectional view showing an example of a semiconductor device of this invention.

Next, as shown in FIG. 47, wiring grooves 58 are formed in the insulating film 54 by photolithography and RIE and contact holes 59 reaching the diffusion layers 44, 45 are formed in the insulating films 47, 48.

Figure 48:
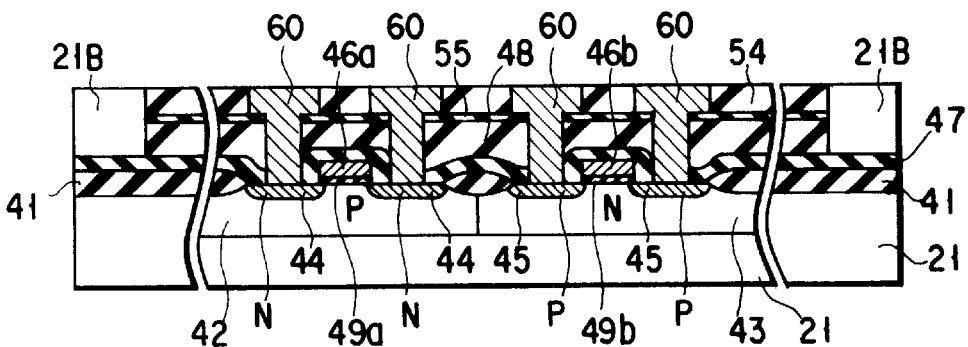
FIG. 48 is a cross sectional view showing an example of a semiconductor device of this invention.

Next, as shown in FIG. 48, a conductive film for completely filling the wiring grooves 58 and contact holes 59 is formed on the insulating film 54.

After this, the CMP process is effected to leave the conductive film behind only in the wiring grooves 58 and contact holes 59.

At this time, a local heavy load is applied to the edge portion of the wafer 21, but since the polishing rate of the wafer 21 is set to be lower than the polishing rate of the insulating film 54, the wafer edge over-polishing will not occur.

Figure 49:
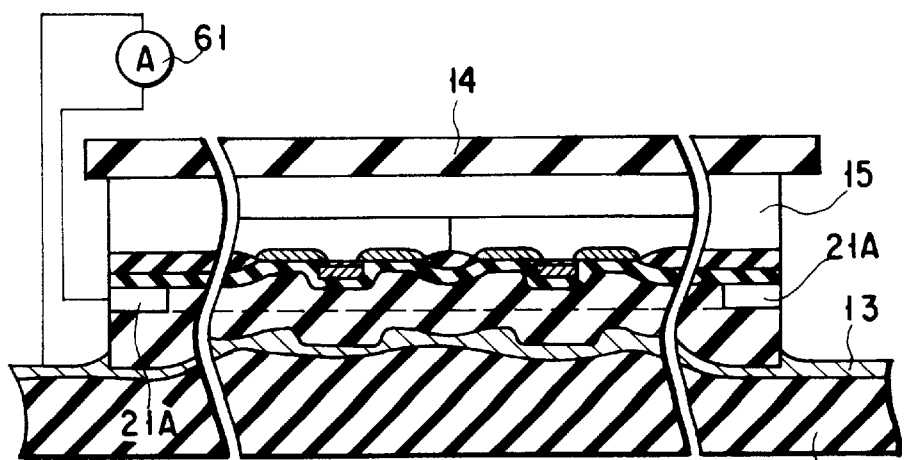
FIG. 49 is a cross sectional view showing a CMP system of this invention.

[G] FIG. 49 shows a CMP system of this invention.

The system of this embodiment can be applied to all of the semiconductor wafers or semiconductor devices according to the embodiments described above.

The feature of this system is that a convex portion 21A formed on the edge portion of a wafer 15 is formed of a conductive material such as polysilicon containing impurity, tungsten or tungsten silicide and a measuring unit such as an ammeter 61 is connected between the convex portion 21A and a slurry (polishing solvent) 13.

That is, since the slurry 13 is generally formed of alkaline solution, the degree of progress of the polishing process by CMP can be detected by monitoring a current value (or resistance) between the convex portion 21A and the slurry 13 during the CMP process.

Figure 50:
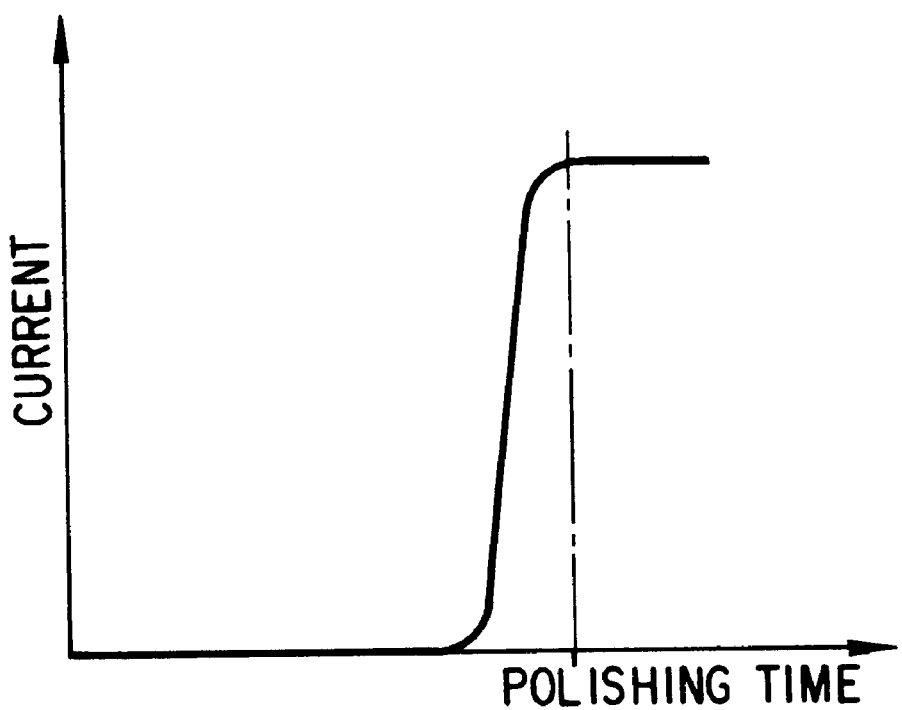
FIG. 50 is a diagram for illustrating the operation of an ammeter of FIG. 49.

For example, in a case where the CMP process is terminated when the convex portion 21A is exposed, the polishing amount by CMP can be precisely controlled by monitoring the current value of the ammeter 61 as shown in FIG. 50.

As described above, according to the semiconductor device of this invention and the method for manufacturing the same, the following effect can be attained.

A convex portion which is formed integrally with or independently from the wafer is formed on the edge portion of the wafer on the main surface side of the wafer. The height of the convex portion is set to a preset value based on various conditions including the number of times of the CMP processes to be effected and the width thereof is set smaller than the width from the wafer edge to a position in front of the chip region.

Thus, since the local heavy load occurring in the edge portion of the wafer is applied only to the convex portion when the CMP process is effected, the wafer edge over-polishing will not occur, and the flatness of the insulating film in the chip region after CMP can be improved and an insulating film or conductive film can be filled only in trenches and grooves.

That is, since generation of dusts from the edge portion of the wafer is suppressed and a constant polishing rate can always be attained in the chip region lying on the inner side from the convex portion, the manufacturing yield and the reliability can be enhanced.

Further, since the wafer edge over-polishing is prevented without particularly modifying or improving the CMP device, the control and maintenance of the CMP device can be easily attained and it is not necessary to form a guide ring on the CMP device, thereby making it possible to lower the cost.

In a case where there is a difference in the selective ratio of the polishing rate of CMP between the materials of the convex portion and the insulating film to be polished, the progress of polishing of the wafer edge portion is suppressed when the convex portion is exposed, and therefore, the wafer edge over-polishing can be effectively prevented.

Further, the polished amount of the insulating film can be precisely detected by forming the convex portion by use of a conductive material and monitoring a current value (or resistance) between the convex portion and the slurry.

This invention can be applied to any type of CMP process such as a process for making an insulating film flat, filling an insulating film (or conductive film) into trenches, or filling a conductive film into wiring grooves in the damascene method and can be effectively used for practically realizing the CMP process.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

What is claimed is:

1. A semiconductor water comprising:
   a semiconductor substrate whose central portion is one concave portion, said central portion includes a plurality of chip regions, and a convex portion disposed only along the edge of said semiconductor substrate, said central portion is surrounded by said convex portion, wherein no element is formed on said convex portion.

2. A semiconductor wafer according to claim 1, wherein said convex portion is part of said semiconductor substrate.

3. A semiconductor wafer according to claim 1, wherein said convex portion is formed of an epitaxial layer formed on said semiconductor substrate.

4. A semiconductor wafer according to claim 1, wherein the width of said convex portion is set to a preset value in a range of 0.5 to 1.5 mm.

5. A semiconductor device comprising:
   a semiconductor substrate whose central portion is one concave portion, said central portion includes a plurality of chip regions;
   a convex portion disposed only along the edge of said semiconductor substrate said central portion is surrounded by said convex portion;
   wirings formed on each of the chip regions; and
   an insulating film having a flat surface and formed to cover said wirings, wherein no element is formed on said convex portion.

6. A semiconductor device according to claim 5, wherein the surface of said insulating film is set at the same level as or near the upper surface of said convex portion.

7. A semiconductor device according to claim 5, wherein said insulating film is formed of one of a BPSG film, TEOS film and LPD-SiO$_2$ film.

8. A semiconductor device comprising:
a semiconductor substrate whose central portion is one concave portion, said central portion includes a plurality of chip regions;
a convex portion disposed only along the edge of said semiconductor substrate said central portion is surrounded by said convex portion;
trenches formed in each of the chip regions; and
an insulating film filled in the trenches, wherein no element is formed on said convex portion.

9. A semiconductor device comprising:
a semiconductor substrate whose central portion is used as a chip region;
a first insulating film formed on said semiconductor substrate; and
a convex portion disposed along the edge of said semiconductor substrate and formed on said first insulating film.

10. A semiconductor device according to claim 9, further comprising trenches formed in said first insulating film and said semiconductor substrate; and a second insulating film filled in said trenches.

11. A semiconductor device according to claim 10, wherein the polishing rate of a material forming said convex portion is smaller than the polishing rate of a material forming said second insulating film.

12. A semiconductor device according to claim 9, further comprising wirings covered with said first insulating film; and a second insulating film formed on said first insulating film, the surface of said second insulating film being made flat.

13. A semiconductor device according to claim 12, wherein the polishing rate of a material forming said convex portion is smaller than the polishing rate of a material forming said second insulating film.

14. A semiconductor device according to claim 12, wherein the surface of said second insulating film lies in the same level as or near the upper surface of said convex portion.

15. A semiconductor device according to claim 12, wherein said wirings include at least gate electrodes of MOS transistors.

16. A semiconductor device comprising:
a semiconductor substrate;
a first insulating film formed on said semiconductor substrate;
first wirings formed on said first insulating film;
a first convex portion formed disposed along the edge of said semiconductor substrate to surround said first wirings on said first insulating film;
a second insulating film having a flat surface and formed on said first insulating film to cover said first wirings with the surface thereof set at the same level as or near the upper surface of said first convex portion;
second wirings formed on said second insulating film;
a second convex portion formed disposed on said first convex portion; and
a third insulating film having a flat surface and formed on said second insulating film to cover said second wirings with the surface thereof set at the same level as or near the upper surface of said second convex portion.

17. A semiconductor device according to claim 16, wherein the width of each of said first and second convex portions is smaller than the width from the edge of said semiconductor substrate to a position in front of a chip region.

18. A semiconductor device according to claim 16, wherein the polishing rate of material forming said first convex portion is smaller than the polishing rate of a material forming said second insulating film and the polishing rate of a material forming said second convex portion is smaller than the polishing rate of a material forming said third insulating film.

19. A semiconductor device comprising:
a semiconductor substrate;
a first insulating film formed on said semiconductor substrate;
first wirings formed on said first insulating film;
a convex portion disposed along the edge of said semiconductor substrate to surround said first wirings on said first insulating film;
a second insulating film having a flat surface and formed on said first insulating film to cover said first wirings with the surface thereof set at a level lower than the upper surface of said convex portion;
second wirings formed on said second insulating film; and
a third insulating film having a flat surface and formed on said second insulating film to cover said second wirings with the surface thereof set at the same level as or near the upper surface of said convex portion.

20. A semiconductor device according to claim 19, wherein the width of said convex portion is smaller than the width from the edge of said semiconductor substrate to a position in front of a chip region.

21. A semiconductor device according to claim 19, wherein the polishing rate of a material forming said convex portion is lower than the polishing rate of a material forming said second and third insulating films.

22. A semiconductor device comprising;
a semiconductor substrate whose central portion is one concave portion, said central portion includes a plurality of chip regions;
a convex portion disposed only along the edge of said semiconductor substrate said central portion is surrounded by said convex portion;
an insulating film having a flat surface and formed above and semiconductor substrate with the surface thereof set at the same level as or near the upper surface, said convex portion;
wiring grooves formed in said insulating film; and
a conductive film formed to fill said wiring grooves, wherein no element is formed on said convex portion.

23. A semiconductor device according to claim 22, wherein the width of said convex portion is smaller than the width from the edge of said semiconductor substrate to a position in front of the central portion.

24. A semiconductor device according to claim 22, wherein the polishing rate of a material forming said convex portion is lower than the polishing rate of a material forming said insulating film.

* * * * *

UNITED STATES PATENT AND TRADEMARK OFFICE
CERTIFICATE OF CORRECTION

PATENT NO. : 6,091,130
DATED : July 18, 2000
INVENTOR(S) : Hisato Oyamatsu et al.

Page 1 of 1

It is certified that error appears in the above-identified patent and that said Letters Patent is hereby corrected as shown below:

<u>Title page Item [57], Abstract,</u>
Line 9, before "of the convex", delete "the".

<u>Column 26, Claim 1,</u>
Line 35, "water" should read -- wafer --.

<u>Claim 5,</u>
Line 56, "substrate said" should read -- substrate, said --.

<u>Claim 7,</u>
Line 67, "and" should read -- or --.

<u>Column 27, Claim 8,</u>
Line 6, "substrate said" should read -- substrate, said --.

<u>Column 28, Claim 22,</u>
Line 40, "comprising;" should read -- comprising: --.
Line 49, "surface, said" should read -- surface of said --.

Signed and Sealed this

Ninth Day of October, 2001

*Attest:*

NICHOLAS P. GODICI
*Attesting Officer*    *Acting Director of the United States Patent and Trademark Office*